US012660200B2

(12) United States Patent
Ocker

(10) Patent No.: US 12,660,200 B2
(45) Date of Patent: Jun. 16, 2026

(54) MEMORY CELLS WITH LEVER ELECTRODES AND ARRANGEMENTS THEREOF

(71) Applicant: Ferroelectric Memory GmbH, Dresden (DE)

(72) Inventor: Johannes Ocker, Dresden (DE)

(73) Assignee: Ferroelectric Memory GmbH, Dresden (DE)

( * ) Notice: Subject to any disclaimer, the term of this patent is extended or adjusted under 35 U.S.C. 154(b) by 808 days.

(21) Appl. No.: 17/813,807

(22) Filed: Jul. 20, 2022

(65) Prior Publication Data

US 2024/0032306 A1 Jan. 25, 2024

(51) Int. Cl.
*H10B 53/30* (2023.01)
(52) U.S. Cl.
CPC .................................... *H10B 53/30* (2023.02)
(58) Field of Classification Search
CPC ........ H10B 53/30; H10B 12/03; H10D 1/682; G11C 11/223; G11C 16/0425; G11C 16/0441
See application file for complete search history.

(56) References Cited

U.S. PATENT DOCUMENTS

| | | | |
|---|---|---|---|
| 10,438,645 | B2 | 10/2019 | Muller |
| 10,460,788 | B2 | 10/2019 | Muller |
| 10,622,051 | B2 | 4/2020 | Muller |
| 10,650,892 | B2 | 5/2020 | Noack |
| 10,978,129 | B1 | 4/2021 | Muller |
| 11,049,541 | B2 | 6/2021 | Muller |
| 11,081,159 | B1 | 8/2021 | Jahne |
| 11,101,291 | B2 | 8/2021 | Mennenga |
| 11,158,361 | B2 | 10/2021 | Muller |
| 11,189,331 | B1 | 11/2021 | Benoist |
| 11,195,589 | B1 | 12/2021 | Ocker |
| 11,289,145 | B2 | 3/2022 | Ocker |
| 11,309,034 | B2 | 4/2022 | Mennenga |
| 11,309,792 | B2 | 4/2022 | Iqbal |
| 11,309,793 | B2 | 4/2022 | Iqbal |
| 11,335,391 | B1 | 5/2022 | Ocker |
| 11,393,518 | B1 | 7/2022 | Ocker |
| 11,443,792 | B1 | 9/2022 | Iqbal et al. |
| 11,475,935 | B1 | 10/2022 | Ocker |
| 11,508,426 | B1 | 11/2022 | Ocker |
| 2019/0130956 | A1 | 5/2019 | Muller et al. |
| 2019/0130957 | A1 | 5/2019 | Muller |

(Continued)

*Primary Examiner* — Jerome Leboeuf
(74) *Attorney, Agent, or Firm* — Natalie Albrecht

(57) ABSTRACT

A memory cell may comprise a field-effect transistor structure comprising a gate structure, the gate structure comprising a floating gate electrode separated from a channel of field-effect transistor structure by a gate isolation; a spontaneously polarizable memory layer, wherein the spontaneously polarizable memory layer covers completely an upper surface of the floating gate electrode and wherein the spontaneously polarizable memory layer covers one or more lateral surfaces of the floating gate electrode; a gate electrode, wherein the spontaneously polarizable memory layer is disposed between the floating gate electrode and the gate electrode to form a capacitive memory structure; and a lever electrode, wherein the spontaneously polarizable memory layer is disposed between the floating gate electrode and the lever electrode to form a lever structure.

20 Claims, 11 Drawing Sheets

(56) References Cited

U.S. PATENT DOCUMENTS

| | | | |
|---|---|---|---|
| 2019/0325963 A1 | 10/2019 | Noack | |
| 2020/0027493 A1 | 1/2020 | Muller et al. | |
| 2020/0357455 A1 | 11/2020 | Noack | |
| 2020/0357470 A1 | 11/2020 | Noack | |
| 2021/0005238 A1 | 1/2021 | Muller | |
| 2021/0082958 A1 | 3/2021 | Mennenga et al. | |
| 2021/0090662 A1 | 3/2021 | Mennenga et al. | |
| 2021/0091097 A1 | 3/2021 | Mennenga | |
| 2021/0125656 A1 | 4/2021 | Muller | |
| 2021/0217454 A1 | 7/2021 | Ocker | |
| 2021/0312969 A1 | 10/2021 | Noack | |
| 2021/0327901 A1 | 10/2021 | Noack | |
| 2021/0336534 A1 | 10/2021 | Iqbal et al. | |
| 2021/0398993 A1* | 12/2021 | Haratipour | H10B 53/30 |
| 2022/0020776 A1 | 1/2022 | Mennenga | |
| 2022/0060105 A1 | 2/2022 | Iqbal | |
| 2022/0122995 A1 | 4/2022 | Ocker | |
| 2022/0122996 A1 | 4/2022 | Ocker | |
| 2022/0122999 A1 | 4/2022 | Polakowski | |
| 2022/0139437 A1 | 5/2022 | Ocker | |
| 2022/0139931 A1 | 5/2022 | Ocker | |
| 2022/0139932 A1 | 5/2022 | Polakowski | |
| 2022/0139933 A1 | 5/2022 | Noack | |
| 2022/0139934 A1 | 5/2022 | Muller | |
| 2022/0139936 A1 | 5/2022 | Ocker | |
| 2022/0139937 A1 | 5/2022 | Muller | |
| 2022/0172791 A1 | 6/2022 | Schenk | |
| 2022/0173114 A1 | 6/2022 | Schenk | |
| 2022/0189524 A1 | 6/2022 | Ocker | |
| 2022/0199166 A1 | 6/2022 | Mennenga | |
| 2022/0270659 A1 | 8/2022 | Ocker | |
| 2022/0277794 A1 | 9/2022 | Noack | |
| 2022/0374202 A1 | 11/2022 | Villa et al. | |
| 2022/0376114 A1 | 11/2022 | Muller | |
| 2022/0392508 A1* | 12/2022 | Li | G11C 11/2273 |
| 2023/0041759 A1 | 2/2023 | Noack et al. | |
| 2023/0046259 A1 | 2/2023 | Iqbal | |
| 2023/0135718 A1 | 5/2023 | Minh et al. | |
| 2023/0170029 A1 | 6/2023 | Sivero | |
| 2023/0189531 A1 | 6/2023 | Muller | |
| 2023/0189532 A1 | 6/2023 | Muller | |
| 2023/0223066 A1 | 7/2023 | Muller | |
| 2023/0247842 A1 | 8/2023 | Muller | |
| 2023/0284454 A1 | 9/2023 | Ocker et al. | |
| 2023/0335174 A1 | 10/2023 | Kuzmanov | |
| 2023/0360684 A1 | 11/2023 | Sivero | |
| 2023/0371268 A1 | 11/2023 | Muller | |
| 2024/0130139 A1* | 4/2024 | Hou | G11C 11/2275 |
| 2024/0306396 A1* | 9/2024 | Zhu | H10B 51/30 |

* cited by examiner

400

104r 106e-1(1,3)

100(1)    100(2)

102(1)

104e-1(1,2)    102(2)

106(1)

104(1)      104(2)      106(2)

102g(1)      102g(2)

106e-1(2,4)

100(3)    100(4)

102(3)    104e 104e-1(3,4)    102(4)

106(3)

104(3)      104(4)      106(4)

102g(3)      102g(4)

MEMORY CELLS WITH LEVER ELECTRODES AND ARRANGEMENTS THEREOF

TECHNICAL FIELD

Various aspects of this disclosure relate to memory cells and memory cell arrangements.

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained by determining in which of the memory states the memory cell is residing in. At present, various types of memory cells may be used to store data. Typically, a large number of memory cells may be implemented in a memory cell array, wherein each of the memory cells or predefined groups of memory cells may be individually addressable. In this case, the information may be read out by addressing the memory cells accordingly. Furthermore, various driver circuits have been developed in semiconductor industry to control an operation of one or more memory cells of a memory device. The memory cells may be implemented in such a way that each single memory cell or at least various groups of memory cells is unambiguously addressable, e.g., for writing (e.g., programming and/or erasing) and/or reading the respective memory cell or groups of memory cells.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1A:
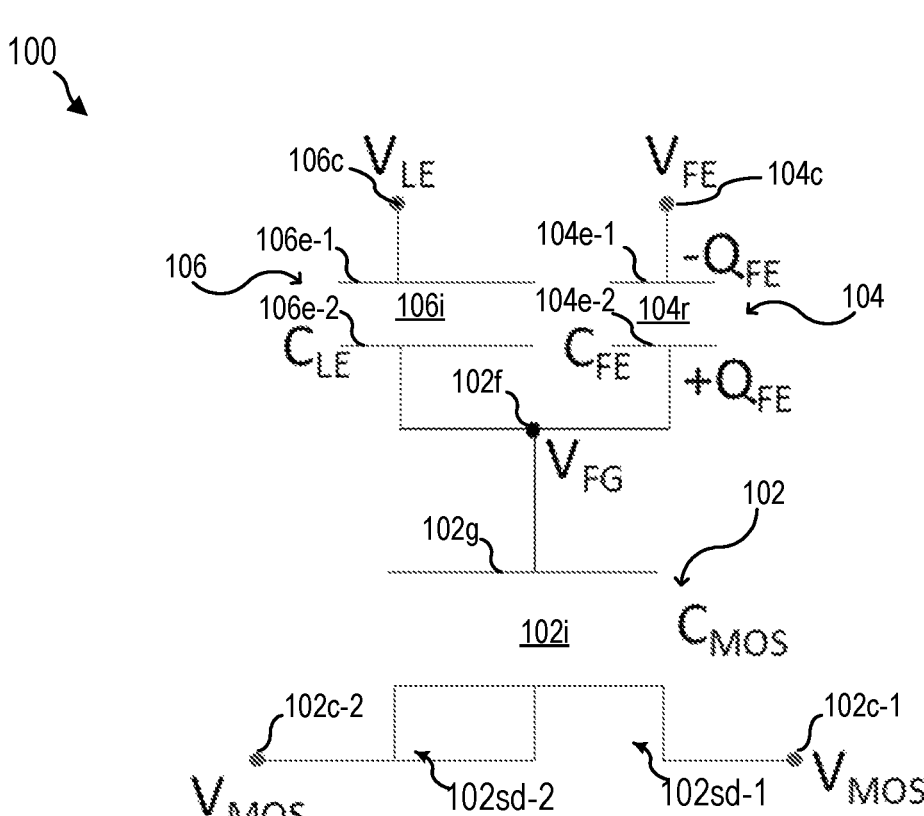
FIG. 1 schematically shows a memory cell, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described in connection with methods and various aspects are described in connection with devices (e.g., arrangements). However, it may be understood that aspects described in connection with methods may similarly apply to the devices, and vice versa.

The terms "at least one" and "one or more" may be understood to include any integer number greater than or equal to one, i.e., one, two, three, four, [ . . . ], etc. The term "a plurality" may be understood to include any integer number greater than or equal to two, i.e., two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The phrase that an element or a group of elements "includes" another element or another group of elements may be used herein to mean that the other element or other group of elements may be part of the element or the group of elements or that the element or the group of elements may be configured or formed as the other element or the other group of elements (e.g., the element may be the other element).

The phrase "unambiguously assigned" may be used herein to mean a one-to-one-assignment (e.g., allocation, e.g., correspondence) or a bijective assignment. As an example, a first element being unambiguously assigned to a second element may include that the second element is unambiguously assigned to the first element. As another example, a first group of elements being unambiguously assigned to a second group of element may include that each element of the first group of elements is unambiguously assigned to a corresponding element of the second group of elements and that that corresponding element of the second group of elements is unambiguously assigned to the element of the first group of elements.

The term "connected" may be used herein with respect to nodes, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g., provided by a metal or degenerate semiconductor in absence of p-n junctions in the current path. The term "electrically conductively connected" may be also referred to as "galvanically connected".

The term "voltage" may be used herein with respect to "one or more bit-line voltages", "one or more word-line voltages", "one or more lever-line voltages", "one or more source-line voltages", "one or more control line voltages", "one or more base voltages" and the like. As an example, the term "base voltage" may be used herein to denote a reference voltage and/or a reference potential for the circuit. With respect to an electrical circuit, the base voltage may be also referred to as ground voltage, ground potential, virtual ground voltage, or zero volts (0 V). The base voltage of an electrical circuit may be defined by the power supply used to operate the electronic circuit. As another example, the term "control line voltage" may be used herein to denote a voltage that is provided to a control line, e.g., of a memory cell arrangement (for example a "word-line voltage" may be provided to a "word-line", a "lever-line voltage" may be provided to a "word-line", a "bit-line voltage" may be provided to a bit-line, and a "source-line voltage" may be provided to a source-line). The sign of a voltage difference (e.g., a voltage drop) may be defined as a potential inside a memory cell (e.g., at a first electrode portion) minus a potential at a second electrode portion of the memory cell.

Illustratively, a voltage provided to a node or a terminal may assume any suitable value depending on the intended operation of the circuit including the node or terminal. For example, a bit-line voltage (referred to as $V_{BL}$ or VBL) may be varied depending on the intended operation of the memory cell arrangement. Analogously, a word-line voltage (referred to as $V_{WL}$ or VWL), a plateline voltage (referred to as $V_{PL}$ or VPL), and/or source-line voltage (referred to as $V_{SL}$ or VSL) may be varied depending on the intended operation of a memory cell arrangement. A voltage provided to a node or terminal may be defined by the respective potential applied to that node or terminal relative to the base voltage (referred to as $V_B$) of the circuit. Further, a voltage drop associated with two distinct nodes or terminals of a circuit may be defined by the respective voltages/potentials applied at the two nodes or terminals. As an example, a bit-line voltage drop associated with a memory cell of a memory cell arrangement (e.g., an electrode of the memory cell) may be defined by the respective voltages/potentials applied at the corresponding memory cell (e.g., the electrode of the memory cell). As an example, an n-type or p-type field-effect transistor (FET) based memory cell may have a first threshold voltage, also referred to as low threshold voltage ($V_{L-th}$), and a second threshold voltage, also referred to as high threshold voltage ($V_{H-th}$). In the case of the n-type field-effect transistor (n-FET) based memory cell, the high threshold voltage, $V_{H-th}$, may be greater than the low threshold voltage, $V_{L-th}$, both with respect to the voltage value and the absolute voltage value (e.g., the $V_{L-th}$ may be +1 V and the $V_{H-th}$ may be 3 V, only as numerical examples), or the high threshold voltage, $V_{H-th}$, may be greater than the low threshold voltage, $V_{L-th}$, only with respect to the voltage value (e.g., the $V_{L-th}$ may be –1 V and the $V_{H-th}$ may be 1 V, or the $V_{L-th}$ may be –2 V and the $V_{H-th}$ may be 0 V, or the $V_{L-th}$ may be –3 V and the $V_{H-th}$ may be –1 V, only as numerical examples). In the case of the p-type field-effect transistor (p-FET) based memory cell, the high threshold voltage, $V_{H-th}$, may be lower than the low threshold voltage, $V_{L-th}$, with respect to the voltage value and higher than the low threshold voltage, $V_{L-th}$, with respect to the absolute voltage value (e.g., the $V_{L-th}$ may be –1 V and the $V_{H-th}$ may be –3 V, only as numerical examples), or the high threshold voltage, $V_{H-th}$, may be lower than the low threshold voltage, $V_{L-th}$, only with respect to the voltage value (e.g., the $V_{L-th}$ may be +1 V and the $V_{H-th}$ may be –1 V, or the $V_{L-th}$ may be +2 V and the $V_{H-th}$ may be 0 V, or the $V_{L-th}$ may be +3 V and the $V_{H-th}$ may be +1 V, only as numerical examples).

According to various aspects, a threshold voltage of a field-effect transistor or a field-effect transistor-based memory cell may be defined as a constant-current threshold voltage (referred to as $V_{th(ci)}$). In this case, the constant-current threshold voltage, $V_{th(ci)}$, may be a determined gate-source voltage, $V_{GS}$, at which the drain current (referred to as $I_D$) is equal to a predefined (constant) current. The predefined (constant) current may be a reference current (referred to as $I_{D0}$) times the ratio of gate width (W) to gate length (L). The magnitude of the reference current, $I_{D0}$, may be selected to be appropriate for a given technology, e.g., 0.1 μA. In some aspects, the constant-current threshold voltage, $V_{th(ci)}$, may be determined based on the following equation: $V_{th(ci)}{=}V_{GS}$ (at $I_D$ $I_{D0}{\cdot}$W/L).

A threshold voltage of a field-effect transistor or a field-effect transistor based memory cell may be defined by the properties of the field-effect transistor or of the field-effect transistor based memory cell (e.g., the materials, the doping, etc.), and it may thus be a (e.g., intrinsic) property of the field-effect transistor or of the field-effect transistor based memory cell.

In some aspects, two voltages may be compared with one another by relative terms such as "greater", "higher", "lower", "less", or "equal", for example. It is understood that, in some aspects, a comparison may include the sign (positive or negative) of the voltage value or, in other aspects, the absolute voltage values (also referred to as the magnitude, or as the amplitude, e.g., of a voltage pulse) are considered for the comparison.

According to various aspects, a memory cell may be addressed via a corresponding access device. An access device may include (e.g., may be), for example, a field effect transistor (FET), such as an n-type or p-type field-effect transistor, a transmission gate, such as an n-type-based or p-type-based transmission gate, or the like. An access device may have a threshold voltage associated therewith. A threshold voltage of an access device (e.g., a field-effect transistor) may be defined by the properties of the access device (e.g., the field-effect transistor), such as the material(s), the doping(s), etc., and it may thus be a (e.g., intrinsic) property of the access device.

According to various aspects, a memory cell may have at least two distinct states associated therewith, for example with two distinct electrical conductivities that can be determined to evaluate in which of the at least two distinct states the memory cell is residing in. A memory cell in general may include a phase-change or phase-change-based memory cell, a ferroelectric or ferroelectric-based memory cell, an anti-ferroelectric or anti-ferroelectric-based memory cell, a remanent-polarizable memory cell, a spontaneous-polarizable memory cell, a capacitor or capacitor-based memory cell, and/or a ferroelectric-capacitor or ferroelectric-capacitor-based memory cell ("FeCAP"). A memory cell may include at least a first memory state and a second memory state. In some aspects, the memory state in which a memory cell is residing in may influence a current characteristic and/or voltage characteristic during readout of the memory cell. The first memory state may be, for example, associated with a logic "1" and the second memory state may be, for example, associated with a logic "0". However, the definition of the memory states and/or the definition of a logic "0" and a logic "1" may be selected arbitrarily. A FET based memory cell (e.g., a remanent-polarizable memory cell) may include a first memory state, for example a low threshold voltage state (referred to as LVT state), and a second memory state, for example a high threshold voltage state (referred to as HVT state). The high threshold voltage state may be, in some aspects, associated with a lower current flow during readout than the low threshold voltage state. The low threshold voltage state may be an electrically conducting state (e.g., associated with a logic "1") and the high threshold voltage state may be an electrically non-conducting state or at least less conducting than the low threshold voltage state (e.g., associated with a logic "0"). However, the definition of the LVT state and the HVT state and/or the definition of a logic "0" and a logic "1" may be selected arbitrarily. Illustratively, the first memory state may be associated with a first threshold voltage of the FET based memory cell, and the second memory state may be associated with a second threshold voltage of the FET based memory cell.

For example, a phase-change memory cell may include a phase change portion. The phase-change portion may be used to implement memory functions, e.g., in a memory cell. The phase-change portion may include a first phase state and a second phase state. For example, a phase-change memory cell may change from a first phase state to a second phase state or vice versa upon applying an electrical signal and may remain in the respective phase state for at least some time (referred to as retention time).

According to various aspects, a spontaneously-polarizable memory cell (e.g., a remanent-polarizable memory cell) may include a spontaneously-polarizable portion (also referred to as spontaneous-polarizable portion, e.g., a remanent-polarizable portion). The spontaneous-polarizable portion may be used to implement memory functions, e.g., in a memory cell. Therefore, according to various aspects, a memory cell may be implemented as a capacitor structure, e.g., as a spontaneous-polarizable capacitor (e.g., a remanent-polarizable capacitor). In general, a spontaneous polarization may be present in a material portion (e.g., a material layer) in the case that the material may have a non-zero electrical polarization, P, upon applying an electric field, E; therefore, a certain value for the material portion may be detected. For example, a spontaneous polarization may be a ferroelectric polarization or an anti-ferroelectric polarization. In general, a remanent polarization (also referred to as retentivity or remanence) may be present in a material portion (e.g., a material layer) in the case that the material may remain polarized upon reduction of an applied electric field, E, to zero; therefore, a certain value for the electrical polarization, P, of the material portion may be detected. Illustratively, a polarization remaining in a material when the electric field is reduced to zero may be referred to as remanent polarization or residual polarization. Therefore, the remanence of a material may be a measure of the residual polarization in the material in the case that an applied electric field is removed. In general, ferroelectricity and anti-ferroelectricity may be concepts to describe a polarization of a material similar to the concepts of ferromagnetism and anti-ferromagnetism that may be used to describe magnetization in magnetic materials.

Further, a remanent-polarizable material may include a spontaneously polarization, for example, with reference to the polarization capability of a material beyond dielectric polarization. The coercivity of a material may be a measure of the strength of the reverse polarizing electric field that may be required to remove a remanent polarization. According to various aspects, an electric coercive field (also referred to as coercive field) may be or represent the electric field required to depolarize a remanent-polarizable layer. A remanent polarization may be evaluated via analyzing one or more hysteresis measurements (e.g., hysteresis curves), e.g., in a plot of polarization, P, versus electric field, E, in which the material is polarized into opposite directions. The polarization capability of a material (dielectric, spontaneous and remanent polarization) may be analyzed using capacity spectroscopy, e.g., via a static (C-V) and/or time-resolved measurement or by polarization-voltage (P-V) or positive-up-negative-down (PUND) measurements.

The polarization state of the remanent-polarizable portion may be switched by means of a capacitor structure. The polarization state of the remanent-polarizable portion may be read out by means of the capacitor structure. The polarization state of the remanent-polarizable portion may define a memory state, e.g., of a memory cell. As an example, the polarization state of the remanent-polarizable portion may influence one or more electrical characteristics of the capacitor structure, e.g., a charging current during charging the capacitor structure.

In a usual capacitor structure, the amount of charge stored therein may be used to define a memory state (e.g., first amount of charge stored in the capacitor structure may define a first memory state and a second amount of charge stored in the capacitor structure may define a second memory state.

According to various aspects, writing a memory cell or performing a write operation of a memory cell may include an operation or a process that modifies the memory state the memory cell is residing in from a (e.g., first) memory state to another (e.g., second) memory state. According to various aspects, writing a memory cell may include programming a memory cell (e.g., performing a programming operation of a memory cell), wherein the memory state the memory cell is residing in after programming may be called "programmed state". For example, programming a remanent-polarizable memory cell may modify the polarization state of the remanent-polarizable memory cell from the first polarization state to the second polarization state (e.g., opposite to the first polarization state). According to various aspects, writing a memory cell may include erasing a memory cell (e.g., performing an erasing operation of a memory cell), wherein the memory state the memory cell is residing in after the erasing may be called "erased state". For example, erasing a remanent-polarizable memory cell may modify the polarization state of the remanent-polarizable memory cell from the second polarization state to the first polarization state. As an example, the programmed state may be associated with a logic "1" and the erased state may be associated with a logic "0". However, the definition of programmed state and erased state may be selected arbitrarily. For example, programming an n-type FET based memory cell may modify the state the memory cell is residing in from the HVT state to the LVT state, whereas programming a p-type FET based memory cell may modify the state the memory cell is residing in from the LVT state to the HVT state. According to various aspects, writing a memory cell may include erasing a memory cell (e.g., performing an erasing operation of a memory cell), wherein the memory state the memory cell is residing in after the erasing may be called "erased state". For example, erasing n-type FET based memory cell may modify the state the memory cell is residing in from the LVT state to the HVT state, whereas erasing a p-type FET based memory cell may modify the state the memory cell is residing in from the HVT state to the LVT state. As an example, the programmed state may be an electrically conducting state (e.g., associated with a logic "1") and the erased state may be an electrically non-conducting state or at least less conducting than the programmed state (e.g., associated with a logic "0"). However, the definition of programmed state and erased state may be selected arbitrarily.

The term "switch" may be used herein to describe a modification of the memory state a memory cell is residing in. For example, in the case that a memory cell is residing in a first memory state, the memory state the memory cell is residing in may be switched such that, after the switch, the memory cell may reside in a second memory state, different from the first memory state. The term "switch" may thus be used herein to describe a modification of the memory state a memory cell is residing in, from a first memory state to a second memory state. The term "switch" may also be used herein to describe a modification of a polarization, for example of a remanent-polarizable portion. For example, a polarization of a remanent-polarizable portion may be switched, such that the sign of the polarization varies from positive to negative or from negative to positive, while the absolute value of the polarization may remain in some aspects substantially unaltered.

According to various aspects, a ferroelectric-capacitor-based memory cell (also referred to as ferroelectric capacitor—"FeCAP") may include a capacitor structure including a ferroelectric material as a remanent-polarizable portion (e.g., a ferroelectric capacitor). The term "ferroelectric" may be used herein, for example, to describe a material that shows a hysteretic charge voltage relationship (Q-V). The ferroelectric material may be or may include ferroelectric $HfO_2$ and/or ferroelectric $ZrO_2$. Ferroelectric $HfO_2$ may include any form of hafnium oxide that may exhibit ferroelectric properties. The ferroelectric material may include, for example, $HfO_2$, $ZrO_2$, a solid solution of $HfO_2$ and $ZrO_2$ (e.g., but not limited to it a 1:1 mixture) or $HfO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferro-electricity in hafnium oxide. According to various aspects, a ferroelectric material may be an example of a material used in a remanent-polarizable portion. According to various aspects, a ferroelectric portion may be an example of a remanent-polarizable portion.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. In some aspects, a non-volatile memory technology may be based on a memory cell arrangement as described below. The memory cell arrangement may include FeCAP memory cells. Since a ferroelectric material included in a FeCAP memory cell may have at least two stable polarization states, the ferroelectric capacitor may be used as a non-volatile memory cell. Thus, a FeCAP memory cell stores data by means of a ferroelectric material between at least a first electrode and a second electrode of a capacitor structure. According to various aspects, a non-volatile field-effect transistor based memory structure or memory cell may store data for a period of time from hours (e.g., more than 5 hours) to several tens of years (e.g., 10 years, 20 years, etc.), whereas a volatile memory cell may store data for a period of time from nanoseconds to hours (e.g., less than 5 hours).

In comparison to other emerging memory technologies, a remanent-polarizable memory cell, such as a FeCAP based memory cell, may be integrated in the Front-End-of-Line (FEoL) and/or in the Back-End-of-Line (BEoL) process flow, since it may be implemented as a capacitor-type of memory. Accordingly, the integration of the FeCAP based memory cell may comply with a standard FEoL and/or BEoL complementary metal-oxide-semiconductor (CMOS) process flow. Consequently, various integration schemes may be used to integrate a FeCAP based memory cell in different process technologies.

In some aspects, a memory cell arrangement (e.g., an array including a plurality of memory cells) may be operated based on one or more write operations (e.g., program and/or erase operations) and/or one or more readout operations. During a write operation, as example, predefined voltages may be provided to electrical lines (also referred to as control lines or driver-lines), wherein the electrical lines may be connected to the respective nodes (e.g., respective electrodes) of the memory cells to allow for the desired operation. The electrical lines may be referred to, for example, as bit-lines, word-lines, plate-lines, and/or source-lines. All memory cells that are not intended to be written may see a voltage that is at least less than the programming voltage. The programming voltage may be defined by the type and/or design of memory cell. In some aspects, the programming voltage may be in the range from about +1 V to about +10 V. The programming voltage may be determined via one or more electrical measurements. Various timings may be used to provide the respective voltages, e.g., to provide the desired write voltages and/or the desired readout voltages.

In general, a memory cell arrangement may include a plurality of (e.g., volatile or non-volatile) memory cells, which may be accessed individually or on groups via a corresponding addressing scheme. The matrix architecture may be, for example, referred to as "NOR" or "NAND" architecture, depending on the way neighboring memory cells are connected to each other, i.e., depending on the way the terminals of neighboring memory cells are shared, but are not limited to these two types. Another type is, according to various aspects, an "AND" architecture. In a NAND architecture, the memory cells may be organized in sectors (also referred to as blocks) of memory cells, wherein the memory cells are serially connected in a string (e.g., source and drain regions are shared by neighboring transistors), and the string is connected to a first control line and a second control line. Groups of memory cells in a NAND architecture may be connected in series with one another. In a NOR architecture the memory cells may be connected in parallel with one another. A NAND architecture may thus be more suited for serial access to data stored in the memory cells, whereas a NOR architecture may be more suited for random access to data stored in the memory cells.

Various aspects are related to a memory cell arrangement including one or more memory cells. The one or more memory cells may be, for example, one or more FeCAP memory cells. In some aspects, a control circuit may be configured to carry out and/or instruct one or more write operations associated with a writing of one or more memory cells of the memory cell arrangement. In some aspects, a control circuit may be used to control a writing of a single memory cell of the memory cell arrangement (illustratively, a memory cell that is intended to be written). According to various aspects, writing a memory cell may include bringing the memory cell from one of at least two memory states into another one of the at least two memory states of the memory cell.

According to various aspects, a memory cell arrangement may include a plurality of memory cells. A first memory cell of the plurality of memory cells may include a first field-effect transistor structure, a first capacitive memory structure coupled (e.g., capacitively coupled or electronically conductively connected) to a gate of the first field-effect transistor structure, and a first capacitive lever structure coupled to the gate of the first field-effect transistor structure. A second memory cell of the plurality of memory cells may include a second field-effect transistor structure, a second capacitive memory structure coupled to a gate of the first field-effect transistor structure, and a second capacitive lever structure coupled to the gate of the first field-effect transistor structure. The first capacitive lever structure may be disposed in a first recess formed over the gate of the first field-effect transistor structure. The second capacitive lever structure may include disposed in a second recess formed over the gate of the second field-effect transistor structure. In some aspects, e.g., in the case that the memory cell arrangement is in a NOR-configuration, the first capacitive memory structure and the second capacitive memory structure may be disposed in a memory structure region between the first recess and the second recess. In some aspects, e.g., in the case that the memory cell arrangement is in a NAND-configuration or AND-configuration, either the first capacitive memory structure or the second capacitive memory structure may be disposed in a memory structure region between the first recess and the second recess.

In the following various aspects, e.g., various configurations, read schemes, writing schemes, etc., of a memory cell arrangement that include lever-type memory cells are described with reference to FIGS. 1 to 4C.

In the following, unless otherwise defined, the terms "floating gate structure" and "floating gate electrode" may refer to the memory cell, in more detail to a respective floating gate structure and a respective floating gate electrode of said memory cell, which may be simultaneously a gate structure and a gate electrode of a field-effect transistor structure of said memory cell, respectively. Further, unless otherwise defined, the term "gate" and "gate electrode" may refer to the memory cell, in more detail to a respective gate structure and a respective gate electrode of said memory cell, which may be realized by a first capacitive structure (e.g. a first electrode of said first capacitive structure). Furthermore, a control node may also be referred to as a control terminal, and vice versa.

FIG. 1A schematically shows a memory cell 100 according to various aspects. The memory cell 100 may include a first control node 104c (e.g., a node to be connected to a word-line, a node to apply a gate voltage $V_{EE}$, a node to apply a write voltage $V_{PP}$, a node to apply a read voltage $V_G$, as examples) and a second control node 106c (e.g., a node to be connected to a lever-line, a node to apply a lever voltage $V_{LE}$, as examples). The first control node 104c may be a gate node of the memory cell 100. The first capacitor structure 104 may include a first electrode 104e-1, e.g., connected to the first control node 104c of the memory cell 100. The first capacitor structure 104 may further include a second electrode 104e-2 connected to (or part of) the field-effect transistor structure 102, e.g., to a gate structure or a gate node of the field-effect transistor structure 102. In some aspects, the field-effect transistor structure 102 may include a gate electrode 102g to control the field-effect transistor structure 102, e.g., to control a current flow through the field-effect transistor structure 102 or to control a conductivity of a channel of the field-effect transistor structure 102. According to some aspects, the field-effect transistor structure 102 may include (e.g., may be) a long channel MOSFET. A long channel MOSFET may include a channel length greater than about 50 nm. The memory cell 100 may include a floating gate node 102f at which a floating gate voltage $V_{FG}$ may be provided to control the field-effect transistor structure 102 via a gate structure of the field-effect transistor structure 102. In other words, the gate electrode 102g of the field-effect transistor structure 102 may be configured to be electrically floating and therefore act as a floating gate of the memory cell 100. According to various aspects, the second electrode 104e-2 of the first capacitor structure 104 may be connected to the floating gate node 102f. The second electrode 104e-2 and the gate electrode 102g of the field-effect transistor structure 102 may be provided by a common electrode, see, for example, FIG. 4B. The resulting floating gate voltage $V_{FG}$ may be controlled by applying a voltage $V_{FE}$ (e.g., as a function of a desired operation, e.g., a first voltage for a read operation and a second voltage for a write operation) the first control node 104c and a lever voltage $V_{LE}$ (e.g., as a function of the desired operation, e.g., a first lever voltage for a read operation and a second lever voltage for a write operation) to the second control node 106c.

According to various aspects, the first capacitor structure 104 may include a memory layer 104r disposed between the first electrode 104e-1 and the second electrode 104e-2. In some aspects, the memory layer 104r may include (e.g., may be) a remanent-polarizable layer. In other aspects, the memory layer 104r may include one or more spontaneously-polarizable layers (e.g., one or more anti-ferroelectric layers or regions 104r) and one or more charge storage layers. The one or more spontaneously-polarizable layers may increase an efficiency of changing a charge of the one or more charge storage layers due to the spontaneous polarization caused by applying an electric field. According to various aspects, the first capacitor structure 104 may have a layered design including one or more remanent-polarizable layers sandwiched between two electrode layers. One or more remanent-polarizable layers may be provided between the electrodes 104e-1, 104e-2 of the first capacitor structure 104. According to various aspects, the first capacitor structure may be a first capacitive memory structure. According to various aspects, the first capacitor structure may be a ferroelectric capacitor (also referred to as FeCAP). A FeCAP may be the storage element of the memory cell 100 used to bit-wise store information.

According to various aspects, the second capacitor structure 106 may include a first electrode 106e-1 connected to the second control node 106c and a second electrode 106e-2 connected to (or part of) the field-effect transistor structure 102. The second electrode 106e-2 may be, for example, connected to the gate electrode 102g of the field-effect transistor 102 or may be part of the gate electrode 102g of the field-effect transistor 102. According to various aspects, the second electrode 106e-2 of the second capacitor structure 106 may be connected to the floating gate node 102f. According to various aspects, the second electrode 106e-2 of the second capacitor structure 106, the second electrode 104e-2 of the first capacitor structure 104, and the gate electrode 102g of the field-effect transistor structure 102 may be provided by a common electrode, see, for example, FIG. 1C, FIG. 1C and FIG. 4B.

According to various aspects, the second capacitor structure 106 may include an electrically isolating layer 106i disposed between the first electrode 106e-1 and the second electrode 106e-2 of the second capacitor structure 106. According to various aspects, one or more dielectric layers (in other words one or more electrically insulating layers) may be provided between the electrodes 106e-1, 106e-2 of the second capacitor structure 106. In another aspect, one or more remanent-polarizable layers may be provided between the electrodes 106e-1, 106e-2 of the second capacitor structure 106. According to various aspects, the second capacitor structure may be a dielectric capacitor or a ferroelectric capacitor (also referred to as FeCAP). According to various aspects, the second capacitor structure 106 may have a layered design including one or more remanent-polarizable layers and/or one or more dielectric layer sandwiched between two electrode layers.

According to various aspects, the second capacitor structure 106 may be a capacitive lever structure. Therefore, even in the case that the second capacitor structure 106 includes one or more remanent-polarizable layers, these one or more remanent-polarizable layers may not be switched during operation as a lever capacitor. Illustratively, the second capacitor structure 106 may be effectively used as a dielectric (non-spontaneously polarizable) capacitor structure.

According to various aspects, the first capacitor structure 104 and the second capacitor structure 106 may include the same materials but may have a respective capacitance different from one another. In some aspects, the first capacitor structure 104 has a first capacitance $C_{FE}$ and the second capacitor structure 106 has a second capacitance $C_{LE}$, wherein the first capacitance $C_{FE}$ is different from the second capacitance $C_{LE}$. As an example, the capacitance $C_{LE}$ of the second capacitor structure 106 may be greater than the capacitance $C_{FE}$ of the first capacitor structure 104. This may allow, for example, an effective readout of the memory cell 100 and, e.g., at the same time, an effective writing of the memory cell 100. As an example, a lever voltage $V_{LE}$ having a first voltage value may be applied at the second control node 106c during a readout process and a lever voltage $V_{LE}$ having a second voltage value may be applied at the second control node 106c during a write process, wherein the first voltage value may be different from the second voltage value.

There may be various options to modify a capacitance of a capacitor structure, e.g., a distance of the capacitor's electrodes may be decreased to increase the capacitance of the capacitor structure and vice versa. Another possibility may include increasing the effective area of the capacitor's electrodes to increase the capacitance of the capacitor structure. Still another possibility may include using a dielectric material disposed between the capacitor's electrodes, the higher the relative permittivity of the dielectric material the higher the capacitance of the capacitor structure. According to various aspects, an effective area of a capacitor structure may be determined by a geometrical vertical projection of one electrode of the capacitor structure to the other electrode of the capacitor structure. To increase the effective area of a capacitor structure (e.g., while remaining a comparatively low footprint) may be to configure the capacitor structure as a three-dimensional capacitor structure including at least one curved or angled portion.

According to various aspects, the memory cell 100 may include a third control node (e.g., a first source/drain node) 102c-1 coupled (e.g., capacitively coupled or electronically conductively connected) to a first region (e.g., to a first source/drain region) 102sd-1 of the field-effect transistor structure 102 and a fourth control node (e.g., a second source/drain node) 102c-2 coupled to a second region (e.g., to a second source/drain region) 102sd-2 of the field-effect transistor structure 102.

According to various aspects, the field-effect transistor structure 102 may have a third capacitance $C_{MOS}$ associated therewith. In some aspects, the capacitance $C_{MOS}$ of the field-effect transistor structure 102 may result at least partially from the gated design (e.g., from the gate area that is spaced apart from the semiconductor channel) thereof.

According to various aspects, the second capacitor structure 106 may be a non-ferroelectric capacitor structure, i.e., another material than a ferroelectric material may be disposed between the two electrodes 106e-1, 106e-2 of the second capacitor structure 106.

According to various aspects, the second capacitor structure 106 may be or may include a linear capacitor (such as a dielectric capacitor, as example). A linear capacitor may be configured to show a linear behavior in the current-voltage-characteristics, i.e. a linear I-V-curve.

In the following, one or more problems are described that would be relevant if the second capacitor structure 106 would not be included in the memory cell 100, i.e., relevant for a standard 1T1C memory cell having no lever capacitor structure included therein.

A 1T1C ferroelectric field-effect transistor (FeFET) may include a single ferroelectric capacitor (e.g., with a capacitance $C_{FE}$) connected to a gate of a single field-effect transistor structure (e.g., with a capacitance $C_{MOS}$). The charge created by the ferroelectric capacitor may modify the effective floating gate voltage $V_{FG}$ to control the field-effect transistor. According to various aspects, the capacitances $C_{MOS}$ and $C_{FE}$ of the two elements may be adjusted and as a result, a voltage drop over the ferroelectric capacitor may be tuned to have either an efficient write operation or an efficient read operation, i.e., either to reduce the floating gate voltage $V_{FG}$ or to reduce (e.g., minimize) read disturb, as explained in more detail below.

In a first case, the capacitance $C_{MOS}$ may be significantly greater than the capacitance $C_{FE}$. This may allow for a reduction of the write voltage $V_{PP}$. An advantage may be that the write voltage can be reduced, since most of the voltage may drop over the ferroelectric capacitor ($C_{FE}$). However, a disadvantage may be that—during a read operation—the read voltage $V_G$ may drop mainly over the ferroelectric capacitor ($C_{FE}$), which may reduce the control over the field-effect transistor structure ($C_{MOS}$). The field-effect transistor may in some cases not be controlled effectively in the case that the capacitance ratio of $C_{MOS}$ and $C_{FE}$ is high, because most of the voltage may drop over the ferroelectric capacitor ($C_{FE}$), which may potentially lead to a read disturb due to rewriting the memory state during reading. Furthermore, the capacitance of the field-effect transistor (e.g., of a MOSFET) may be non-linear, which may make it difficult to set a specific capacitance ratio $C_{MOS}/C_{FE}$.

In a second case, the $C_{FE}$ may be significantly greater than $C_{MOS}$. This may allow for a reduction of the read disturb. An advantage may be that a read disturb can be avoided, since most of the voltage may drop across the field-effect transistor ($C_{MOS}$). However, a disadvantage may be that during a write operation all the voltage may drop over the field-effect transistor, which increases the voltage that is necessary to write the memory cell. Further, the voltage drop over $C_{MOS}$ and $C_{FE}$ due to the ferroelectric charge may be increased with a decreasing $C_{MOS}/C_{FE}$ ratio, which may lead to a depolarization of the ferroelectric capacitor ($C_{FE}$).

Compared to commonly used approaches, the memory cell 100 described herein may include a lever capacitor structure in addition to the ferroelectric capacitor. In this case, the ferroelectric capacitor may be used to store the actual information in the memory cell and the lever capacitor may be used to modify the voltage regimes in the memory cell 100 for an improved operation. The lever capacitor (e.g., embodied by the second capacitor structure 106) may be used to modify the voltage distribution among the elements of the memory cell 100 so that reading and writing can be performed efficiently, as explained in more detail below.

According to various aspects, memory cell 100 including a lever capacitor ($C_{LE}$) is provided, e.g., wherein the lever capacitor ($C_{LE}$) may be used to change the voltage that drops over the ferroelectric capacitor during write and read. The use of a lever capacitor may allow, for example, a reduction of write voltages and an avoidance of a destructive read or any other read disturb. The lever capacitor may be a ferro-electric capacitor, a dielectric capacitor, e.g., any suitable capacitor structure. The ferroelectric capacitor that stores the actual information (e.g., embodied by the first capacitor structure 104) and the lever capacitor can be of different capacitances. The equation to calculate the floating gate potential may be given by as follows:

$$V_{FG} \approx (V_{FE}C_{FE} + V_{LE}C_{LE} + V_{MOS}C_{MOS} + Q_{FE})/(C_{FE} + C_{LE} + C_{MOS}),$$

wherein $V_{FE}$ may be the voltage applied to the ferroelec-tric capacitor, $V_{LE}$ may be the voltage applied to the level capacitor, $V_{MOS}$ may be the voltage applied to the field-effect transistor (e.g., to the source/bulk and drain of the field-effect transistor), $Q_{FE}$ may be the ferroelectric charge, $C_{LE}$ may be the capacitance of the lever capacitor, and $C_{FE}$ may be the capacitance of the ferroelectric capacitor (see FIG. 1A).

As an example, during a write operation, a write voltage $V_{PP}$ (also referred to as programming voltage, write poten-tial, programming potential) may be applied to the ferro-electric capacitor node such that VW may be substantially equal to the write voltage $V_{PP}$ whereas the lever capacitor and the field-effect transistor (e.g., embodied by the field-effect transistor structure 102) may be grounded such that a base voltage $V_{SS}$ may be substantially equal to $V_{LE}$ and such that $V_{LE}$ may be substantially equal to $V_{MOS}$. Depending on the lever capacitance $C_{LE}$ and the field-effect transistor capacitance $C_{MOS}$, the voltage drop over the ferroelectric capacitor may be tuned to $C_{MOS} + C_{LE}$ being substantially greater than $C_{FE}$ and most of the write voltage $V_{PP}$ may drop over the ferroelectric capacitor. This may reduce the write voltage significantly and create a ferroelectric polarization charge $Q_{FE}$.

Under the assumption that $C_{MOS} + C_{LE}$ is substantially greater than $C_{FE}$, the equation to calculate the floating gate potential gives the following result:

$$V_{FG} \approx V_{FE}C_{FE}/(C_{LE} + C_{MOS}) \approx V_{SS}.$$

It may be noted that this goal can be achieved with a classical FeFET structure that has only one capacitor con-nected to the gate in the case that $C_{MOS}$ is chosen large enough. However, this may cause read disturb issues as described above. However, a read disturb may be prevented by using the configuration described herein with respect to the memory cell 100, as explained in more detail below.

During reading the memory cell (e.g., to detect the ferroelectric charge $Q_{FE}$), a read voltage $V_G$ may be applied to both the ferroelectric capacitor node (such that $V_{FE}$ may be substantially equal to the read voltage $V_G$) and to the lever capacitor node (such that $V_{LE}$ may be substantially equal to the read voltage $V_G$). However, a voltage that is lower than the read voltage $V_G$ may be applied to the lever capacitor node, e.g., a voltage in the range from half of read voltage $0.5 * V_G$ to the read voltage $V_G$. As an example, the read voltage may be applied to both the first control node 104c and the second control node 106c of the memory cell 100. Hence the capacitance divider provided by the two capacitors 104, 106 and the field-effect transistor structure 102 of the memory cell 100 may be changed by the applied voltages and provide the condition that $C_{MOS}$ may be sig-nificantly less than $C_{LE} + C_{FE}$ and, as a result, most of the voltage may drop over the field-effect transistor structure 102 that allows a non-destructive read.

According to various aspects, due to the additional ter-minal connected to the lever capacitor (e.g., due to the second control terminal 106c), it may be possible to change the effective capacitance divider of the memory cell 100 during write and/or read. This allows, for example, for an avoidance of the disadvantages described above with refer-ence to a standard 1T1C memory cell. If $C_{LE}$ may be substantially greater than $C_{MOS}$ and if $C_{LE}$ may be substan-tially greater than $C_{FE}$, the non-linearity of the MOS capaci-tance may be reduced significantly in the case that the lever capacitor $C_{LE}$ is a linear capacitor.

Under the assumption that $C_{MOS}$ is substantially less than $C_{LE} + C_{FE}$, the equation to calculate the floating gate poten-tial gives the following result:

$$V_{FG} \approx V_G + Q_{FE}/C_{LE}.$$

According to various aspects, the drain voltage applied to the third control node 102c-1 may be utilized to transfer charge over the inversion layer of the field-effect transistor structure 102 and to read out the ferroelectric state of the first capacitor structure 104.

During retention, all terminals (in other words all control nodes 102c-1, 102c-2, 104c, 106c) of the memory cell 100 may be grounded and the floating gate potential ($V_{FG}$) may depend mainly on the lever capacitance ($C_{LE}$) provided that $C_{LE}$ may be substantially greater than $C_{MOS}$ and if $C_{LE}$ may be substantially greater than $C_{FE}$, which may be utilized to reduce the depolarization field of the ferroelectric, as can be seen from the following equation:

$$V_{FG} \approx Q_{FE}/C_{LE}.$$

According to various aspects, the lever capacitance value may be selected accordingly to get a sufficiently high change in the floating gate voltage $V_{FG}$ of the field-effect transistor during a read operation and a low floating gate potential during retention phase.

Figure 1B:
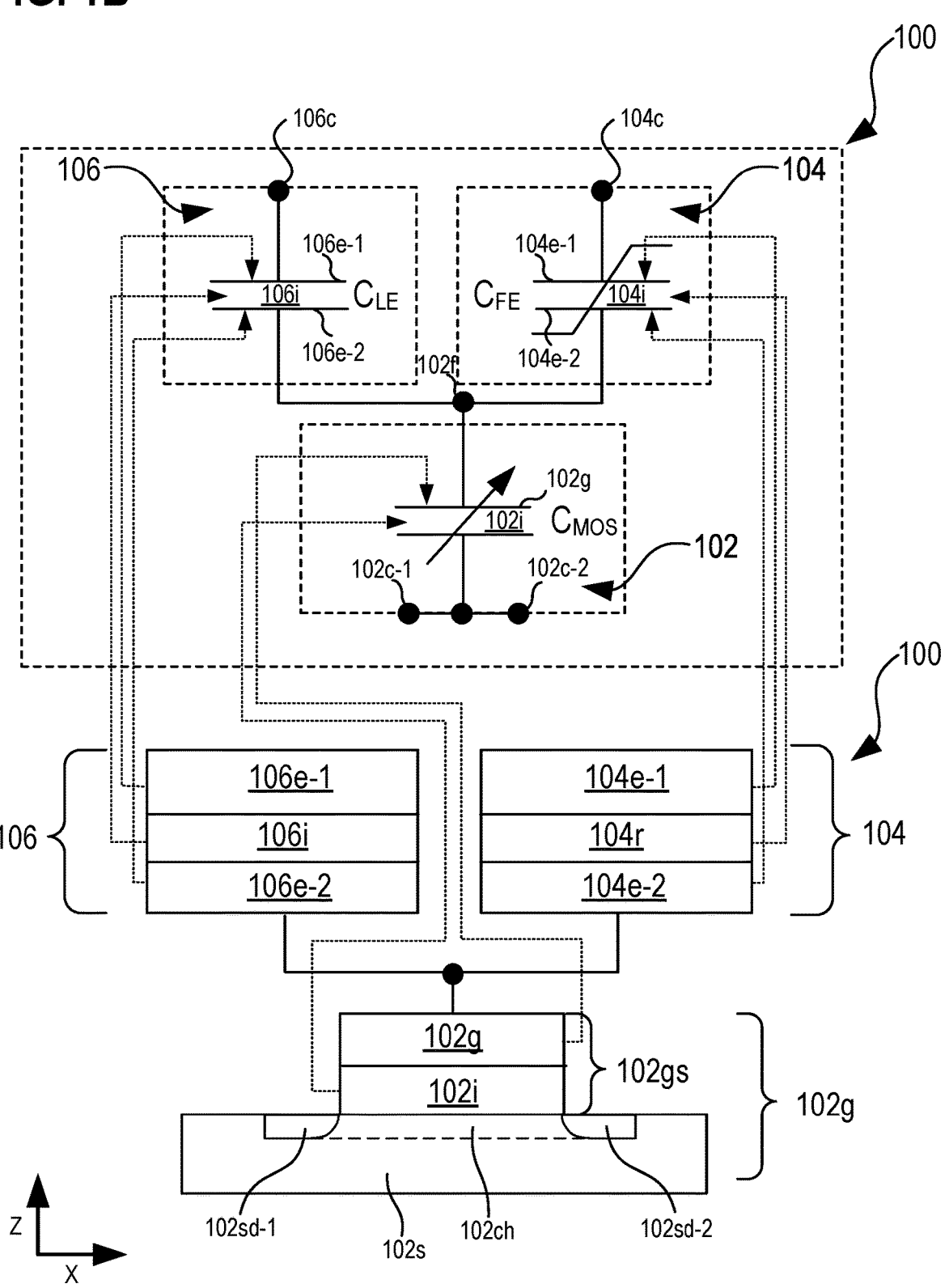

As described above, the capacitive structures of the memory cell may be realized as layered structures. FIG. 1B shows exemplarily shows a schematic memory cell 100 according to various aspects. In the upper part of FIG. 1B, the memory cell 100 is shown as a schematic electrical circuit, as it was explained above with respect to FIG. 1A. In the lower part of FIG. 1B, the memory cell 100 is shown as a schematic layered structure. For example, the described structures of the memory cell 100, i.e., the first capacitor structure 104, the second capacitor structure 106 as well as the field-effect transistor structure 102, may each comprise several layers.

In more detail, the field-effect transistor structure 102 may include a gate structure 102gs, wherein the gate structure 102gs may include a gate isolation 102i (also referred to as gate dielectric) and a gate electrode 102g. It is noted that the gate electrode 102g of the field-effect transistor structure 102, that is, for example, in contact with the gate isolation 102, forms a floating gate node 102f of the memory cell 100 due to the capacitive memory structure 104 that is connected to or integrated in the gate structure 102gs of the field-effect transistor structure 102. The gate structure 102gs is illus-trated exemplarily as a planar gate stack; however, it may be understood that the planar configuration shown in FIG. 1B is an example, and other field-effect transistor designs may include a gate structure 102gs with a non-planar shape, for example a trench gate transistor design, a vertical field-effect transistor design, or other designs, such as a fin-FET design. The gate structure 102gs may define a channel region 102ch, e.g., provided in a semiconductor portion 102s (e.g., in a semiconductor layer, in a semiconductor die, etc.). The gate structure 102gs may allow for a control of an electrical behavior (e.g., a resistance) of the channel region 102ch, e.g., a current flow in the channel region 102ch may be controlled (e.g., allowed, increased, prevented, decreased, etc.). In some aspects, the gate structure 102gs may, for example, allow to control (e.g., allow or prevent) a source/drain current from the first region 102sd-1 (e.g. the first source/drain region) of the field-effect transistor structure 102 to the second region 102sd-2 (e.g. the second source/drain region) of the field-effect transistor structure 102. The channel region 102ch and the first and the second region 102sd-1, 102sd-2 may be formed, e.g., via doping one or more semiconductor materials or by the use of intrinsically doped semiconductor materials, within a layer and/or over a layer. With respect to the operation of the field-effect transistor structure 102, a voltage may be provided (e.g., transferred to the floating gate node 102f of the memory cell 100) at the gate electrode 102g field-effect transistor structure 102 of the to control the current flow in the channel region 102ch, the current flow in the channel region 102ch being caused by voltages supplied via the source/drain regions 102sd-1, 102sd-2. For example, the voltage provided (e.g., transferred to the floating gate node 100f of the memory cell 100) at the gate electrode 102g of the field-effect transistor structure 102 may be influenced by a gate voltage $V_{FE}$ supplied to an first (e.g., upper) electrode 104e-1 of the first capacitive structure 104 (e.g., the gate voltage $V_{EE}$ supplied to the gate node 104c of the memory cell 100). For example, the voltage provided (e.g., transferred to the floating gate node 102f of the memory cell 100) at the gate electrode 102g of the field-effect transistor structure 102 may be influenced by a lever voltage supplied to an first (e.g., upper) electrode 106e-1 of the second capacitive structure 106 (e.g., the lever voltage $V_{LE}$ supplied to the lever node 106c of the memory cell 100). The floating gate electrode 102g may include an electrically conductive material. According to various aspects, the gate isolation 102i may be configured to provide an electrical separation of the gate electrode 102g from the channel region 102ch and further to influence the channel region 102ch via an electric field generated by the gate electrode 102g. The gate isolation 102i may include one or more electrically insulating layers, as an example.

In some aspects, the gate electrode 102g of the field-effect transistor structure 102 and the second electrode 104e-2 of the first capacitive structure 104 that is connected to the field-effect transistor structure 102 may be spatially separated from one another and electrically connected via a conductive connection, e.g., one or more metal lines (see FIG. 1B). Furthermore, the gate electrode 102g of the field-effect transistor structure 102 and the second electrode 106e-2 of the second capacitive structure 106 that is connected to the field-effect transistor structure 102 may be spatially separated from one another and electrically connected via a conductive connection, e.g., one or more metal lines (see FIG. 1B).

Figure 1C:
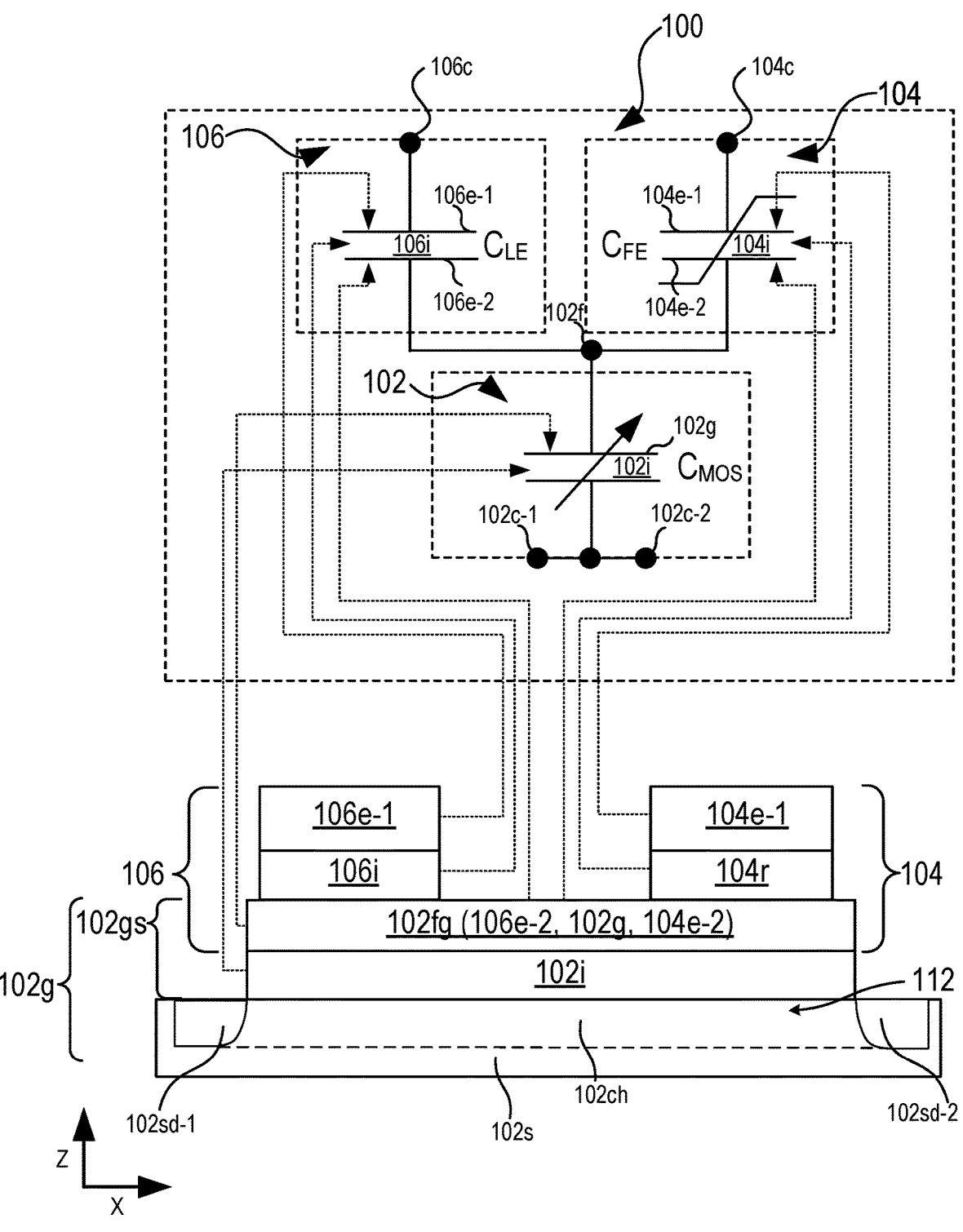

A memory cell according to various aspects is shown in FIG. 1C. As it can be seen, the gate electrode 102g of the field-effect transistor structure 102 and the second electrode 104e-2 of the first capacitive structure 104 may be in direct physical contact with one another or may be implemented as a single (shared) floating electrode 102fg of the memory cell incorporating the functionalities of the gate electrode 102g of the field-effect transistor structure 102 and the second electrode 104e-2 of the first capacitive structure 104. Additionally, or alternatively, the gate electrode 102g of the field-effect transistor structure 102 and the second electrode 106e-2 of the second capacitive structure 106 may be in direct physical contact with one another or implemented as a single (shared) floating electrode 102fg of the memory cell incorporating the functionalities of the gate electrode 102g of the field-effect transistor structure 102 and the second electrode 106e-2 of the second capacitive structure 104. Thus, the floating electrode 102fg may not be directly electrically conductive connected to any of the first electrode 104e-1 of the first capacitive structure 104 and/or the first electrode 106e-1 of the second capacitive structure 106, respectively. In other words, the floating electrode 102fg is electrically floating. However, the floating electrode 102fg, that may control electrical properties of the channel region 102ch of the field-effect transistor structure, may be controlled by the first electrode 104e-1 of the first capacitive structure 104 and/or the first electrode 106e-1 of the second capacitive structure 106, respectively.

Figure 1D:
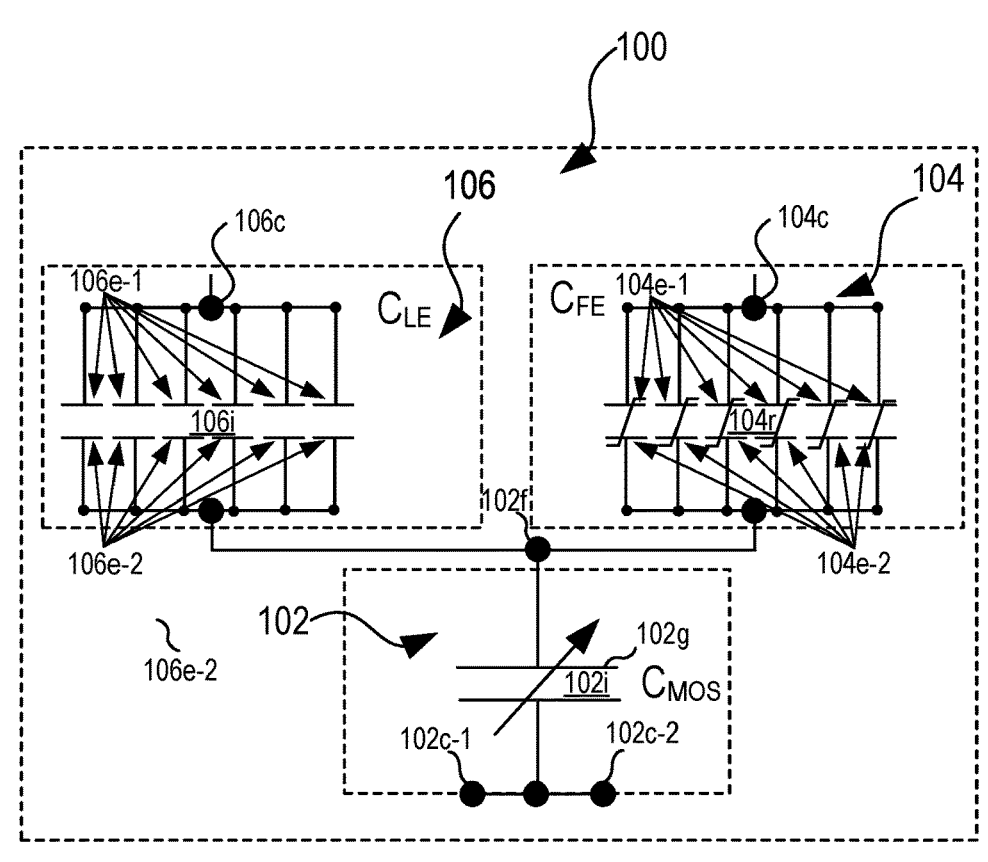
Figure 1D:
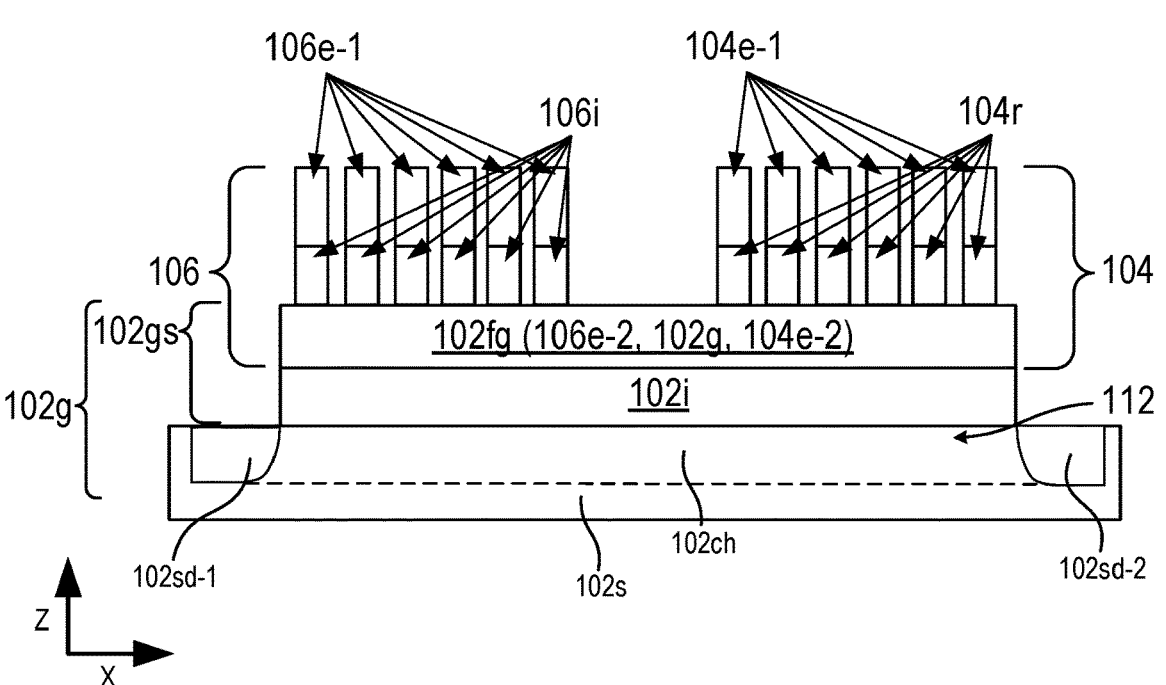

It may be noted that the first capacitor structure 104 and the second capacitor structure 106 are illustrated (e.g., in FIG. 1A, FIG. 1B, FIG. 1C) as single capacitors. However, the first capacitor structure 104 may include more than one capacitor, e.g., a first capacitor arrangement including at least two capacitors (e.g., at least two FeCAPs) coupled (e.g., capacitively coupled or electronically conductively connected) in parallel between the first control node 104c and the floating gate node 102f. The second capacitor structure 106 may (also) include more than one capacitor, e.g., a second capacitor arrangement including at least two capacitors (e.g., at least two dielectric capacitors, e.g., at least two ferroelectric capacitors) coupled in parallel between the second control node 106c and the floating gate node 102f. Exemplarily, a memory cell 100 according to various aspects as described is depicted in FIG. 1D. Here, the first and the second memory structure may each comprise a respective capacitor arrangement, whereby the capacitors of each arrangement are coupled in parallel, respectively. Each capacitor of the first capacitor arrangement may be embodied as a single first capacitive structure 104 described before. Each capacitor of the second capacitor arrangement may be embodied as a single second capacitive structure 106 described before.

Figure 2:
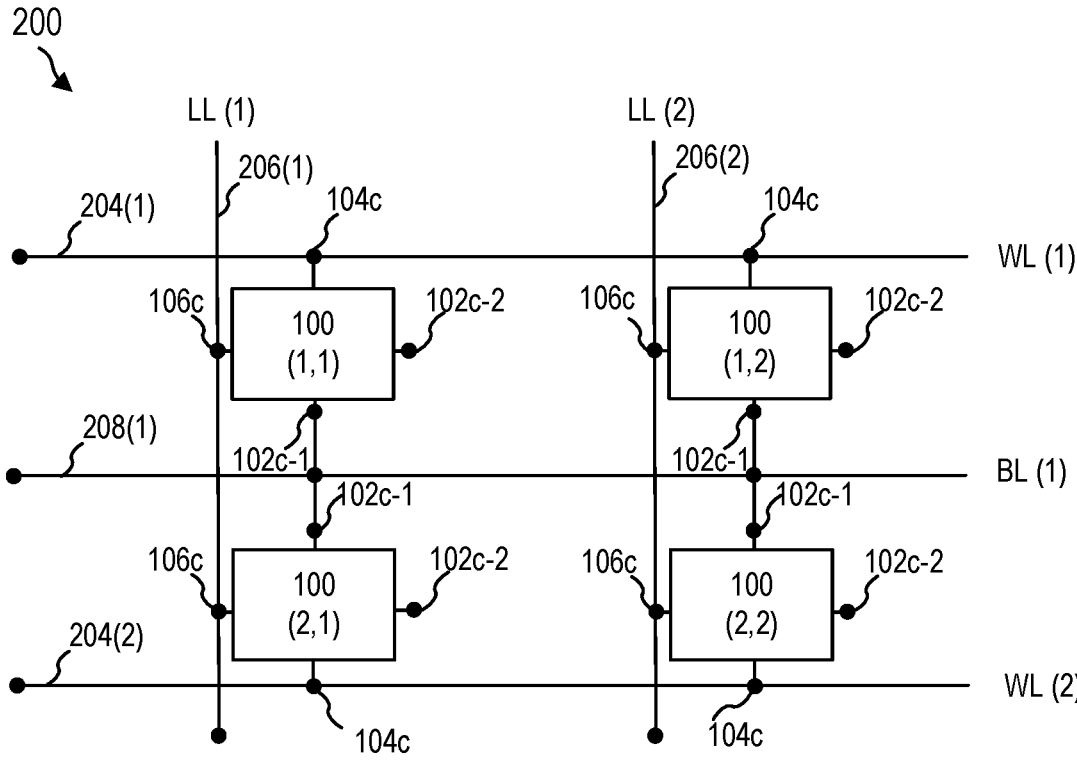
FIG. 2 schematically shows a memory cell arrangement, according to various aspects.

FIG. 2 illustrates schematically an exemplary configuration of a memory cell arrangement 200, according to various aspects. In some aspects, the memory cell arrangement 200 may include a plurality of memory cells 100, as described herein. However, other suitable memory cells may be used in the same or on a similar way. As an example, each memory cell 100 of the memory cell arrangement 200 may include a field-effect transistor structure (referred to as field-effect transistor, FET), a first capacitor structure 104, and a second capacitor structure 106. In the following, the first capacitor structure 104 may be a ferroelectric capacitor structure. The ferroelectric capacitor structure may include (e.g., may be) a ferroelectric capacitor (FeCAP), and may, therefore, be referred to as ferroelectric capacitor structure. The second capacitor structure may be referred to as lever capacitor structure (LeCAP). The second capacitor structure may include (e.g., may be) a ferroelectric capacitor, a dielectric capacitor, or any other suitable capacitor. In some aspects, the memory cells 100 of the memory cell arrangement 200 may be configured as described with reference to memory cell 100 illustrated in FIG. 1A, FIG. 1B, FIG. 1C, and FIG. 1D. In another aspect, each memory cell 100 of the memory cell arrangement 200 may be configured so that the first capacitor structure and the second capacitor structure have the same capacitance. In some aspects, each memory cell 100 of the memory cell arrangement 200 may include two ferroelectric capacitors, wherein one of the two ferroelectric capacitors (e.g. included by the first capacitor structure) may be configured to store a charge representing the actual information (e.g., representing a logic "0" or a logic "1") of the memory cell 100 and wherein the other one of the two ferroelectric capacitors (e.g. included by the second capacitor structure) may be configured as a lever capacitor. A capacitor structure of the memory cell configured to store the charge representing the actual information may also be referred to as capacitive memory structure and the corresponding capacitor(s) may be referred to as memory capacitor(s).

As described above, each memory cell 100 of the memory cell arrangement 200 may include at least four (control) nodes or, in other words, four terminals. The nodes/terminals may be used to address the memory cells 100 of the memory cell arrangement 200 to read and/or write the respective memory cells 100. FIG. 2 illustrates a memory cell arrangement 200 according to various aspects, wherein each memory cell 100 comprises a first control node 104c (referred to as "word-line node" or "gate node"), a second control node 106c (referred to as "lever-line node"), a third control node 102c-1 (referred to as "bit-line node" or "drain node"), and a fourth control node 102c-2 (referred to as "source-line node"). Briefly, the first control node 104c may be connected to first capacitive structure 104 (e.g., the ferroelectric capacitor) of the memory cell 100. The second control node 106c may be connected to the second capacitive structure 106 (e.g., the lever capacitor) of the memory cell 100. The third control node 102c-1 may be connected to the field-effect transistor of the memory cell 100 (e.g., to a first source/drain region of the field-effect transistor, referred to as drain). The fourth control node 102c-2 may be connected to the field-effect transistor of the memory cell 100 (e.g., to a second source/drain region of the field-effect transistor, referred to as source).

As an example, by applying respective voltages at the control nodes, an electrical behavior of the third control node 102c-1 and the fourth control node 102c-2 of the respective memory cell 100 may be controlled. As an example, a current flow between the fourth control node 102c-2 ("source-line node") and the third control node 102c-1 ("bit-line node"/"drain node") may be controlled by applying respective voltages to the first control node 104c ("word-line node"/"gate node") and the second control node 106c ("lever-line node"). As another example, a voltage output at the third control node 102c-1 may be controlled by applying respective voltages to the first control node 104c and the second control node 106c. In more detail, the third control node 102c-1 may be connected to a bit-line, which may be used to identify a respective memory state of the corresponding memory cell(s) by identifying a change in a sensing voltage. The sensing voltage may be a voltage present in the bit-line that may be changed by charging or discharging a memory cell depending on its memory state.

According to various aspects, each memory cell of the plurality of memory cells 100 of the memory cell arrangement 200 may be a field-effect transistor (FET) based memory cell, and may include two source/drain regions and a gate structure (of the FET structure) to control a current flow between the two source/drain regions. The first control node 104c of the memory cell 100 (i.e., the gate node) may be capacitively coupled to the floating gate structure 102gs of the memory cell 100 (i.e., the gate structure of the FET structure) via the first capacitor structure 104 (e.g., via the ferroelectric capacitor). The fourth control node 102c-2 of the memory cell 100 (e.g. the source node) may be electrically conductively connected to the source region 102sd-2 of the field-effect transistor structure 102 of the corresponding memory cell 100. The third control node 102c-1 of the memory cell (i.e., the drain node) may be electrically conductively connected to the drain region of the field-effect transistor structure 102 of the corresponding memory cell 100.

The memory cells 100 of the memory cell arrangement 200 may be arranged, for example, in a matrix architecture. The memory cells 100 may be arranged in a number, n, of columns, and in a number, m, of rows, with m and n integer numbers greater than 1. FIG. 2 illustrates two columns (e.g., a first column and a second column) and two rows (a first row and a second row) of a memory cell arrangement 200 including two memory cells 100 each, only as an example. The memory cell arrangement 200 may include any suitable number of memory cells 100, arranged in any suitable number, n, of columns, and in any suitable number, m, of rows. The memory cells 100 in each row may from a respective first subset of memory cells and the memory cells 100 in each column may from a respective second subset of memory cells.

According to various aspects, the memory cell arrangement 200 may include a plurality of control-lines 204, 206, 208 (e.g., one or more word-lines, WL, one or more bit-lines, BL, and one or more lever-lines, LL), coupled (e.g., capacitively coupled or electronically conductively connected) to the memory cells 100. The control-lines 204, 206, 208 may be used to supply voltages/potentials to control nodes of the memory cells 100. The plurality of control-lines 204, 206, 208 may be arranged in any suitable way defined, for example, by the desired matrix architecture of the memory cell arrangement 200.

According to various aspects, the first control node 104c (i.e., the word node) of each memory cell 100 may be connected to a corresponding first control-line 204(1), 204 (2) (e.g., to a corresponding word-line WL of the one or more word-lines). Each of the one or more word-lines may electronically conductively connect the first control nodes 104c of multiple memory cells 100 with each other. The second control node 106c of each memory cell 100 may be connected to a corresponding second control-line 206(1), 206(2) (e.g., to a corresponding lever-line LL of the one or more lever-lines). Each of the one or more lever-lines may electronically conductively connect the second control nodes 106c of multiple memory cells 100 with each other.

According to various aspects, the third control node 102c-1 (i.e., the bit-line node) of each memory cell 100 may be connected to a corresponding third control-line 208(1) (e.g., to a corresponding bit-line BL of the one or more bit-lines). Each of the one or more bit-lines may electronically conductively connect the third control nodes 102c-1 of multiple memory cells 100 with each other.

According to various aspects, the fourth control node 102c-2 (i.e., the source node) of each memory cell 100 may be connected to a common control node (e.g., a common source-node or a common source region). However, if desired, the fourth control nodes 102c-2 could be addressed via one or more corresponding fourth control-lines (not shown), e.g., via one or more corresponding source-lines (not shown).

Illustratively, each memory cell 100 of the memory cell arrangement 200 may be unambiguously assigned to one word-line, WL, one lever-line, LL, and one bit-line, BL. According to various aspects, the memory cell arrangement 200 may include one or more word-lines, (e.g., a first word-line, WL(1), and a second word-line, WL(2), as an example), one or more bit-lines (e.g., a first bit-line, BL(1), and a second bit-line, BL(2), as an example), and one or more lever-lines (e.g., a first lever-line, LL(1), and a second lever-line, LL(2), as an example). The memory cell arrangement 200 may include any suitable number of control lines.

According to various aspects, each word-line, WL, may be coupled (e.g., capacitively coupled or electronically conductively connected) to each memory cell 100 in a same row of memory cells 100. Each lever-line, LL, may be coupled to each memory cell 100 in a same column of memory cells 102.

According to various aspects, each bit-line, BL, may be coupled to each memory cell 100 in a same row of memory cells 202. According to various aspects, each bit-line, BL, may be coupled to each memory cell 100 a pair of rows of memory cells 202 which are directly adjacent to each other, as shown in FIG. 2. However, each bit-line may only be coupled to one pair of rows of memory cells. In other words, the plurality of memory cells may be arranged in one or more row-pairs. Each row-pair may include two adjacent rows of memory cells. Each row-pair of the one or more row-pairs may correspond to exactly one bit-line of the plurality of bit-lines, and each bit-line of the plurality of bit-lines may correspond to exactly one row-pair of the one or more row pairs. The memory cells of each row-pair may be connected to the bit-line corresponding to the respective row-pair via the respective bit-line nodes of the memory cells.

According to various aspects, the word-lines and the lever-lines may be connected to different subsets of memory cells 100 of the memory cell arrangement 200. According to various aspects, the bit-lines and the lever-lines may be connected to different subsets of memory cells 100 of the memory cell arrangement 200. According to various aspects, the bit-lines and the word-lines may be connected to same subsets of memory cells 100 of the memory cell arrangement 200.

According to various aspects, each memory cell 100 of the memory cell arrangement 200 may include a remanent-polarizable layer (as an example, each of the one or more memory cells 102 may include a FeCAP). Therefore, the memory state a memory cell 100 is residing in may be associated with one of at least two polarization states of the respective remanent-polarizable layer. A first threshold voltage, $V_{L-th}$, of the field-effect transistor of the memory cell 100 may be associated with a first (e.g., positive) residual polarization of the remanent-polarizable layer (e.g., it may be a function of the first residual polarization) and the second threshold voltage, $V_{H-th}$, of the field-effect transistor of the memory cell 100 may be associated with a second (e.g., negative) residual polarization of the remanent-polarizable layer (e.g., it may be a function of the second residual polarization).

According to various aspects, the memory cell arrangement 200 may include a control circuit. The control circuit may be configured to carry out and/or instruct one or more read operations and/or one or more write operations associated with a reading and/or writing of the memory cells 100 of the memory cell arrangement 200. The control circuit may be configured to supply one or more control signals (e.g., one or more read signals, one or more write signals, etc.) to the memory cells 100. Illustratively, one or more read signals and one or more write signals may be provided to the respective memory cell that is intended to be read and/or written. The control signals may be understood as any (e.g., constant or time-varying) potential or voltage provided at the respective nodes of the memory cells and/or to the control lines of the memory cell arrangement 200.

According to various aspects, the control circuit may include and/or may control one or more voltage supply circuits. The one or more voltage supply circuits may be used for supplying control voltages (e.g., a read voltage, $V_G$, a write voltage, $V_{PP}$, a base voltage, $V_{SS}$, as examples) to the control-lines 204, 206, 208 of the memory cell arrangement 200, e.g., for supplying voltages to the respective control nodes 201-1, 201-2, 201-3, 201-4 of the one or more memory cells 100. According to various aspects, the control circuit may define a base voltage $V_{SS}$, (also referred to as a ground voltage) (for example $V_{SS}$=0 V) associated with the memory cell arrangement 200.

According to various aspects, during readout of a memory cell, a drain current, $I_D$, may be created at the bit-line corresponding to the memory cell to be read out (e.g., by applying a readout voltage and a lever voltage accordingly), wherein the drain current may vary as a function of a gate-source voltage drop and, therefore, as a function of the memory state (e.g., LVT state or HVT state) the memory cell is residing in. As an example, a current flow through the memory cell may reflect the memory state the memory cell is residing in in the case that a gate-source voltage drop falls between the first threshold voltage, $V_{L-th}$, and the second threshold voltage, $V_{H-th}$.

In the following, one or more problems are described that may be relevant for a conventional AND architecture used to implement a memory cell arrangement based on standard 1T1C-FeFET memory cells having no lever capacitor structure included therein.

In general, ferroelectric transistors (FeFETs) may be organized in AND architectures, which may allow, for example, a single bit programming but only a word based erase. As an example, if the memory cells of the memory cell arrangement include long channel MOS transistors, only a whole row of memory cells may be erased at once. For short channel MOS transistors, where the depletion zone merges by applying a voltage to source and drain region, a bit erase may be possible. However, a high voltage at the source and drain regions has to be used during inhibition or during bit erase, which may cause substantial reverse junction leakages that increase the power consumption of the memory cell arrangement during operation.

Compared to commonly used approaches, the memory cells described herein may include at least two capacitors; and, in some aspects, the memory cells may be embed into an array to prevent disadvantages mentioned above, e.g., to prevent a substantial reverse junction leakage during a bit erase, to avoid substantial read and write disturbs, as examples.

A memory cell, onto which an operation (e.g., programming (writing or erasing), reading) is to be performed may be referred to as an active memory cell. The other memory cells onto which no operation is to be performed are referred to as passive memory cells. To address the memory cells in a memory cell arrangement, the respective control lines are used: the lever-lines, the word-lines, the bit-lines and the source-lines, as described above. A word-line, onto which an active word voltage $V_{FE,ACT}$ is applied to is referred to as an active word line. A word-line, onto which a passive word voltage $V_{FE,PAS}$ is applied to is referred to as a passive word line. A lever-line, onto which an active lever voltage $V_{LE,ACT}$ is applied to is referred to as an active lever-line. A lever-line, onto which a passive lever voltage $V_{LE,PAS}$ is applied to is referred to as a passive lever-line. A bit-line, onto which an active bit voltage $V_{BL,ACT}$ is applied to is referred to as an active bit-line. A bit-line, onto which a passive bit voltage $V_{BL,PAS}$ is applied to is referred to as a passive bit-line. A memory cell of the memory cell arrangement, onto which the active word voltage $V_{FE,ACT}$, the active lever voltage $V_{LE,ACT}$, and the active bit voltage $V_{BL,ACT}$ are applied to, is referred to as active memory cell. A memory cell of the memory cell arrangement, onto which, two or fewer active voltages are applied to, is referred to as passive memory cell. An active memory cell may also be referred to as a selected memory cell (since it is selected by the corresponding active control lines). The passive memory cells may be referred to as unselected memory cells.

Figure 3A:
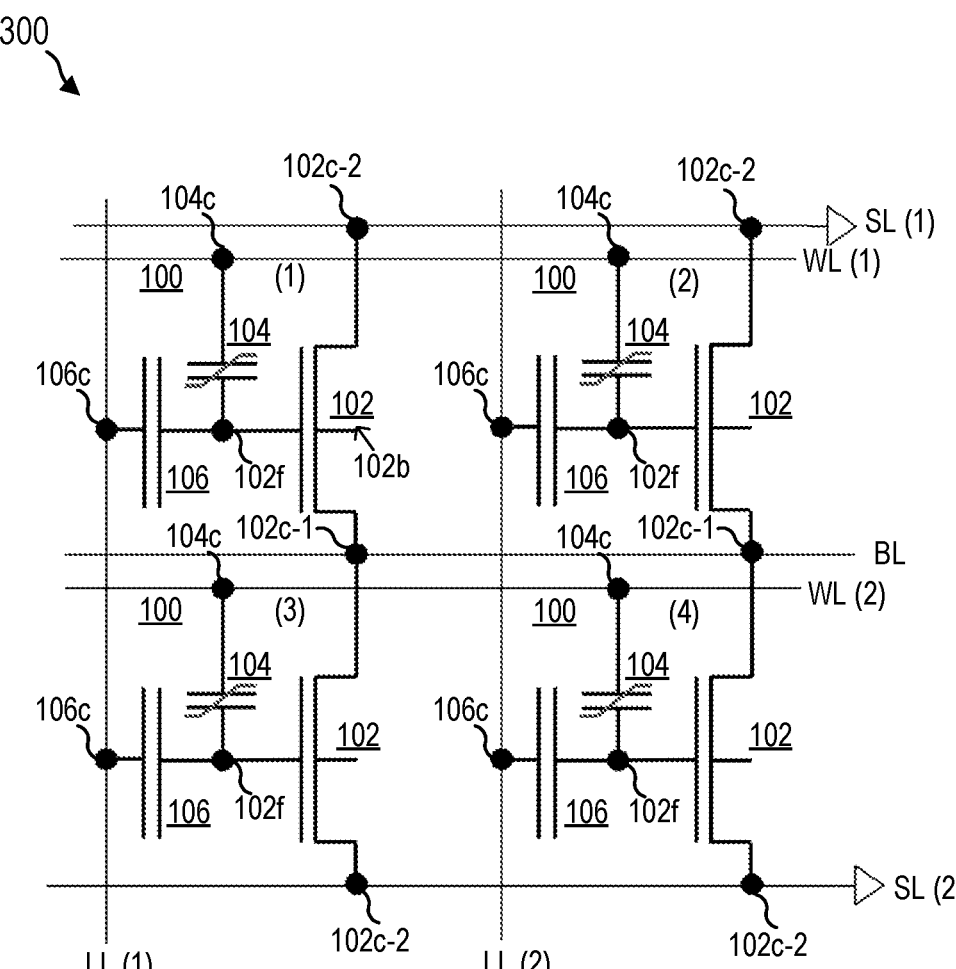
FIG. 3A schematically shows a memory cell arrangement having a AND architecture according to various aspects.
Figure 3B:
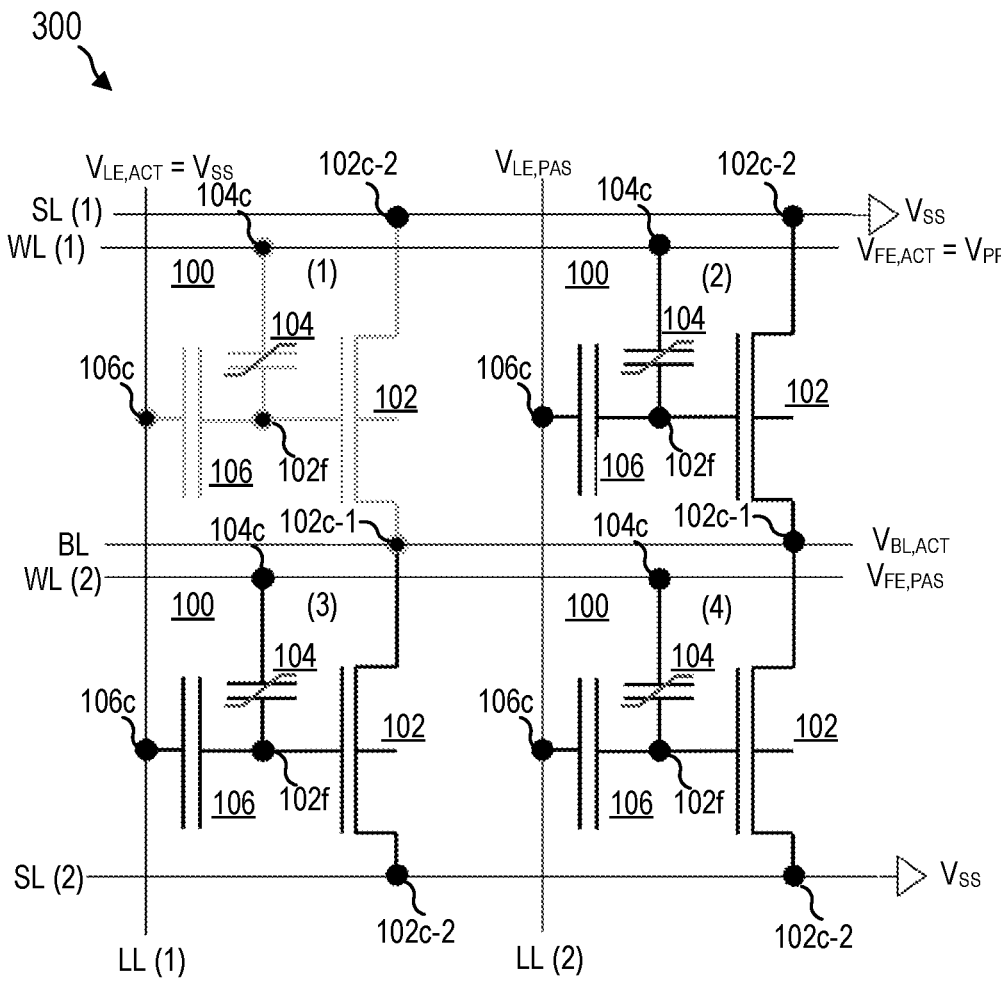
FIG. 3B schematically shows a memory cell arrangement having a AND architecture during writing a memory cell of the memory cell arrangement, according to various aspects.
Figure 3C:
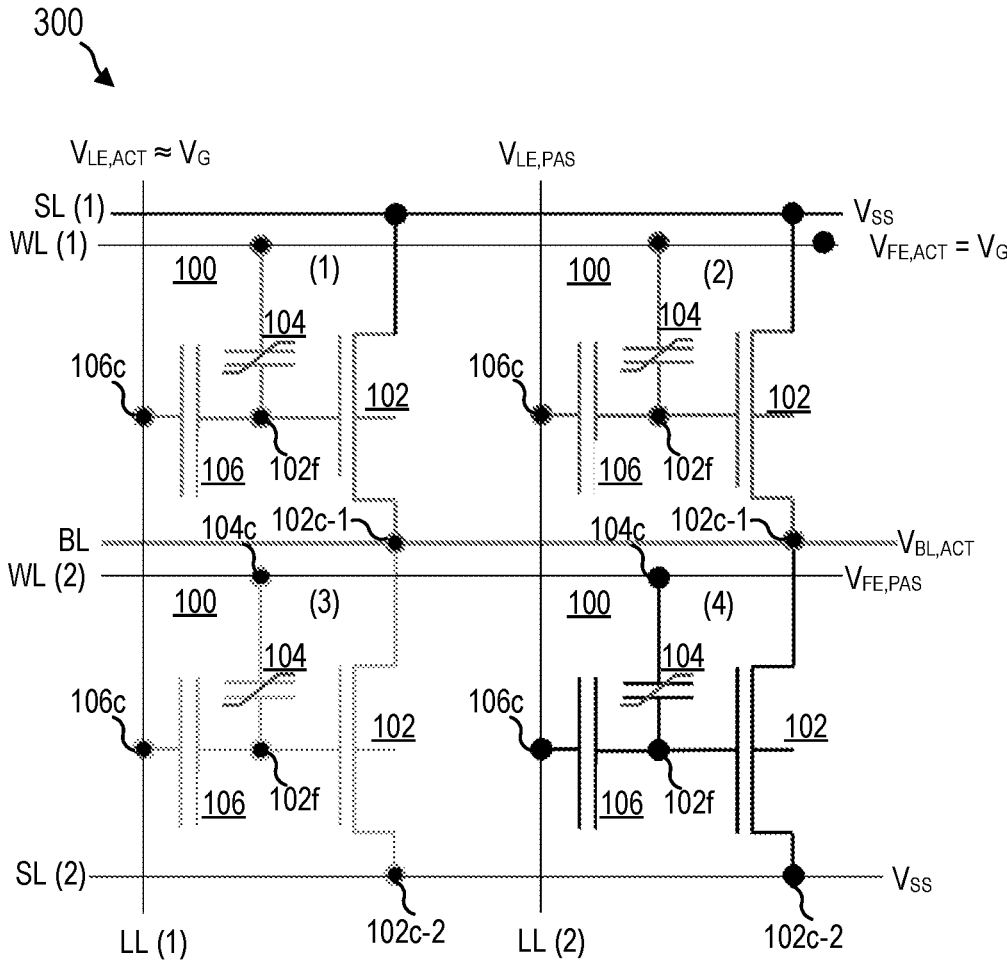
FIG. 3C schematically shows a memory cell arrangement having a AND architecture during reading a memory cell of the memory cell arrangement, according to various aspects.

According to various aspects, the 1T2C memory cells of a memory cell arrangement (e.g., of memory cell arrangement 200 described herein with reference to FIG. 1) may be organized as an array to realize an AND architecture based on a four-terminal levered FeFET cell, as illustrated in FIG. 3A, FIG. 3B, and FIG. 3C.

FIG. 3A shows exemplarily the arrangement of four 1T2C memory cells in a memory cell arrangement 300, according to various aspects. Each memory cell 100 of the memory cell arrangement 300 may be realized as described above with reference to the memory cell 100. The memory cell arrangement 300 may be configured in the same way or in a similar way as described herein with reference to the memory cell arrangement 200.

The first capacitor structure 104 (e.g., a ferroelectric capacitor) of each memory cell 100 may be connected to a corresponding word-line WL (e.g., to a first word-line WL(1), to a second word-line WL(2)) via its corresponding first control node 104c and to the floating gate 102f of the respective memory cell 100. The second capacitor structure 106 of each memory cell 100 may be connected to a corresponding lever-line (e.g., to a first lever-line LL(1), to a second lever-line LL(2)) via the corresponding second control node 106c and to the floating gate 102f of the respective memory cell 100. The field-effect transistor may be connected with its first source/drain region to a corresponding shared bit-line BL via the third control node 102c-1, and with its second source/drain region to a corresponding source-line SL (e.g., to a first source-line SL(1), to second source-line SL(2)) via the fourth control node 102c-4. A common source potential may be applied to the source-lines SL.

Just as an example, in the following, the first capacitor structure 104 may be a ferroelectric capacitor, the second capacitor structure 106 may be a lever capacitor, and the field-effect transistor structure may be a field-effect transistor. It is understood, that this is just an example for an illustrative purpose and is not intended to limit the subject-matter.

According to various aspects, one or more (e.g. all) of the memory cells 100 may have a fifth node, which is exemplarily shown for the first memory cell 100 of the memory cell arrangement 300 (see, FIG. 3A top left memory cell). The fifth contact may be a bulk node 102b onto which a bulk voltage $V_{BULK}$ may be applied to. The bulk node may be electrically connected to field-effect transistor structure 102, e.g., to the substrate 102s of the field-effect transistor structure 102. As an example, each of the one or more memory cells 100 (e.g. a subset or all) of the memory cell arrangement 300 may have a separate bulk contact 102b thereby allowing an individual bulk voltage to be applied to each of the one or more memory cells 100. As another example, the one or more memory cells 100 (e.g. a subset or all) of the memory cell arrangement 300 may have common bulk contact 102b thereby allowing the same bulk voltage to be applied to the one or more memory cells 100.

In FIG. 3B shows exemplarily a writing process of one memory cell 100 of the memory cell arrangement 300. In this example, it may be assumed that only a selected memory cell of the memory cell arrangement 300 is intended to be written (is selected to be written, e.g., referred to as selected memory cell). Just as an example a first memory cell (1) of the memory cell arrangement 300 is selected. To program or erase the first memory cell (1), a write voltage $V_{PP}$ may be applied to the active word-line connected to the ferroelectric capacitor of the first memory cell (1). In this case, an active word voltage $V_{FE,ACT}$ applied at the corresponding word-line WL (e.g., a first word-line WL(1)) may be the write voltage $V_{PP}$ (also referred to as programming voltage). In this case, the active word voltage $V_{FE,ACT}$ applied to the corresponding word-line WL (e.g., the first word-line WL(1)) may be, for example, the write voltage $V_{PP}$ (e.g., $V_{PP}$=-3 V) or a voltage close to the write voltage $V_{PP}$ (e.g., a voltage in the range from about -3.25 V to about -2.75 V). Further, to program or erase the first memory cell (1), a base voltage $V_{SS}$ or a voltage close to the base voltage may be applied to the active lever-line connected to the lever capacitor of the first memory cell (1). In this case, an active lever voltage $V_{LE,ACT}$ applied to the corresponding lever-line LL(1) may be, for example, the base voltage $V_{SS}$ (e.g., $V_{SS}$=0 V) or a voltage close to the base voltage $V_{SS}$ (e.g., a voltage in the range from about -0.25 V to about +0.25 V). However, voltage greater than the base voltage $V_{SS}$ may be applied to the active lever-line connected to the lever capacitor of the first memory cell (1), e.g., a voltage in the range from about the base voltage $V_{SS}$ to about half the write voltage 0.5*$V_{PP}$. Further, to program or erase the first memory cell (1), the base voltage $V_{SS}$ or a voltage close to the base voltage $V_{SS}$ may be applied to the active bit-line connected to the field-effect transistor of the first memory cell (1). In this case, the active bit voltage $V_{BL,ACT}$ applied to the corresponding (shared) bit-line BL may be, for example, the base voltage $V_{SS}$ (e.g., $V_{SS}$=0 V) or a voltage close to the base voltage $V_{SS}$ (e.g., a voltage in the range from about -0.25 V to about +0.25 V).

According to various aspects, the write voltage $V_{PP}$ may be, for example, in the range from about +1 V to about +10 V, e.g. from about +1.5 V to about +6 V.

According to various aspects, a voltage value of the write voltage $V_{PP}$ and a voltage value of the active lever voltage $V_{LE,ACT}$ applied to the corresponding active lever-line may be of opposite sign. For example, the write voltage $V_{PP}$ may have a positive voltage value and the active lever voltage $V_{LE,ACT}$ may have a negative voltage value, or vice versa. According to an example, the write voltage $V_{PP}$ may have a voltage value of $V_{PP}$=+3.0 V and the active lever voltage $V_{LE,ACT}$ may have a voltage value of $V_{LE,ACT}$=-3.0 V, respectively.

According to various aspects, a disturbance of the other memory cells 100 of the memory cell arrangement 300 may be prevented during writing the first memory cell (1).

As an example, to avoid a disturbance of the memory cell (2) of the memory cell arrangement 300 during writing the first memory cell (1), a voltage different from the base voltage $V_{SS}$ may be applied to the passive lever-line connected to the lever capacitor of the non-selected memory cell (2). A voltage different from the base voltage $V_{SS}$ may be applied to all passive lever-lines connected to the lever capacitors of the non-selected memory cells of the memory cell arrangement 300 that share the same word-line WL (e.g. the first word-line WL(1)) as the first memory cell (1). According to various aspects, the passive lever voltage $V_{LE,PAS}$ applied to the corresponding lever-line LL (e.g., the second lever line LL(2)) may be, for example, in the range from about half the absolute of the write voltage, i.e., $0.5*|V_{PP}|$, to about the absolute of the write voltage, i.e., $|V_{PP}|$.

According to various aspects, a voltage value of the active lever voltage $V_{LE,ACT}$ and a voltage value of the passive lever voltage $V_{LE,PAS}$ applied to all passive lever-lines connected to the lever capacitors of the non-selected memory cells of the memory cell arrangement 300 may be of opposite sign. For example, the active lever voltage $V_{LE,ACT}$ may have a negative voltage value and the passive lever voltage $V_{LE, PAS}$ may have a positive voltage value, or vice versa. According to an example, the active lever voltage $V_{LE,ACT}$ may have a voltage value of $V_{LE,ACT}$=+3.0 V and the passive lever voltage $V_{LE,PAS}$ may have a voltage value of $V_{LE,PAS}$=−1.0 V.

According to various aspects, applying the passive lever voltages $V_{LE,PAS}$ of opposite sign as compared to the active lever voltage $V_{LE,ACT}$ and/or as compared to the write voltage $V_{PP}$ may ensure that the memory state of the non-selected memory cells is not changed (e.g., neither written nor erased).

As an example, to avoid disturb of the memory cells (3), (4) of the memory cell arrangement 300 during writing the first memory cell (1), a voltage different from the write voltage $V_{PP}$ may be applied to the passive word-line connected to the ferroelectric capacitor of the non-selected memory cells (3), (4). A voltage different from the write voltage $V_{PP}$ may be applied to all passive word-lines connected to the ferroelectric capacitors of the non-selected memory cells of the memory cell arrangement 300 that do not share the same word-line WL(1) as the first memory cell (1). According to various aspects, a passive word voltage $V_{FE,PAS}$ applied to the corresponding word-line WL (e.g., to the second word-line WL(2)) may be, for example, in the range from about 0 V (or the base voltage $V_{SS}$) to about half of the absolute of the write voltage, i.e., $0.5*|V_{PP}|$.

According to various aspects, a voltage value of the write voltage $V_{PP}$ and a voltage value of the passive word voltage $V_{FE,PAS}$ (may also referred to as inhibit voltage) applied to all passive word-lines connected to the ferroelectric capacitors of the non-selected memory cells of the memory cell arrangement 300 may be of opposite sign. For example, the write voltage $V_{PP}$ may have a positive voltage value and the passive word voltage $V_{FE,PAS}$ may have a negative voltage value, or vice versa. According to an example, the write voltage $V_{PP}$ may have a voltage value of $V_{PP}$=−3.0 V and the passive word voltage $V_{FE,PAS}$ may have a voltage value of $V_{FE,PAS}$=+1.0 V.

Further, to avoid disturb of additional memory cells which are not connected to the active bit-line (not shown in FIGS. 3A-3C) of the memory cell arrangement 300 during writing the first memory cell (1), the base voltage $V_{SS}$ or a voltage close to the base voltage may be applied to corresponding passive bit-lines connected to the field-effect transistor of the additional non-selected memory cells that are not connected to the active bit-line (not shown). In this case, a passive base voltage $V_{BL,PAS}$ applied to the corresponding passive bit-lines may be, for example, 0 V or a voltage close to 0 V (e.g., a voltage in the range from about −0.25 V to about +0.25 V).

As described exemplarily above, individual memory cells of the memory cell arrangement 300 can be erased. It is noted that some or all of the voltages described are only examples and that deviations from the described voltages may be possible.

As further described exemplarily above, the third control nodes (or third terminals) of the memory cell 100 connected to the bit-line (e.g., connected to the source/drain regions of the field-effect transistor of the memory cell 100) may be kept at the base voltage $V_{SS}$ (or at least close to the base voltage $V_{SS}$) eliminating the power consumption from reverse junction leakage from bulk to source and drain during inhibition.

FIG. 3C shows exemplarily a reading of a selected memory cell of the memory cell arrangement 300, according to various aspects. Again, just as an example, it may be assumed that only the first memory cell (1) of the memory cell arrangement 300 is intended to be read (is selected to be read, referred to as selected memory cell). To read the first memory cell (1), a read voltage $V_G$ may be applied to the active word-line connected to the ferroelectric capacitor of the first memory cell (1). In this case, an active word voltage $V_{FE,ACT}$ applied to the corresponding word-line WL (e.g., the first word-line WL(1)) may be the read voltage $V_G$.

Further, to read the first memory cell (1), an active lever voltage $V_{LE,ACT}$ may be applied to the active lever-line connected to the lever capacitor of the first memory cell (1). In this case, the active lever voltage $V_{LE,ACT}$ applied to the corresponding lever-line LL (e.g., a first lever-line LL(1)) may be substantially equal to the read voltage $V_G$.

Further, to read the first memory cell (1), a potential/voltage greater than the base voltage $V_{SS}$ may be applied to the active bit-line connected to the field-effect transistor of the first memory cell (1). In this case, the active bit voltage $V_{BL,ACT}$ applied to the corresponding (shared) bit-line BL may be, for example, equal to or greater than 0 V. In an example, the active bit voltage $V_{BL,ACT}$ applied to the corresponding shared bit-line BL may be $V_{BL,ACT}$=+1 V.

The third and fourth control nodes the memory cells (i.e., the first and the second source/drain terminals of the field-effect transistor) may be brought and/or kept at a voltage at or close to the base voltage $V_{SS}$ (e.g., a voltage of 0 V or in the range from about −0.25 V to about +0.25 V).

According to various aspects, a voltage value of the read voltage $V_G$ and a voltage value of the active lever voltage $V_{LE,ACT}$ applied to the corresponding lever-line may be of the same sign. For example, the read voltage $V_G$ may have a positive voltage value and the active lever voltage $V_{LE,ACT}$ may have a positive voltage value, too. More preferably, the read voltage $V_G$ and the voltage value of the active lever voltage $V_{LE,ACT}$ may be nearly equal or are equal to each other, thereby allowing a high voltage being applied to the floating gate.

According to various aspects, disturb of the other memory cells 100 of the memory cell arrangement 300 may be prevented during reading the first memory cell (1).

As an example, to avoid disturb of a second memory cell (2) of the memory cell arrangement 300 during reading the first memory cell (1), a voltage different from the read voltage $V_G$ may be applied to the passive lever-line connected to the lever capacitor of the non-selected second memory cell (2). A voltage different from the read voltage $V_G$ may be applied to all passive lever-lines connected to the lever capacitor of the non-selected memory cells of the memory cell arrangement 300 that share the same word-line WL (e.g., the first word-line WL(1)) as the first memory cell (1). According to various aspects, a passive lever voltage $V_{LE,PAS}$ applied to the corresponding lever-line LL (e.g., the second lever line LL(2)) may be, for example, in the range from about the base voltage $V_{SS}$ (e.g., $V_{SS}$=0 V) to about half the absolute of the read voltage, i.e., $0.5*|V_G|$.

According to various aspects, a voltage value of the active lever voltage $V_{LE,ACT}$ and a voltage value of the passive lever voltage $V_{LE,PAS}$ applied to all passive lever-lines connected to the lever capacitors of the non-selected memory cells of the memory cell arrangement 300 may be of opposite sign. For example, the active lever voltage $V_{LE,ACT}$ may have a positive voltage value and the passive lever voltage $V_{LE,PAS}$ may have a negative voltage value, or vice versa. According to an example, the active lever voltage $V_{LE,ACT}$ may have a voltage value of $V_{LE,ACT}$=+0.6 V and the second lever passive lever voltage $V_{LE,PAS}$ may have a voltage value of $V_{LE,PAS}$=−0.1 V. In another example, the active lever voltage $V_{LE,ACT}$ may and the passive lever voltage $V_{LE,PAS}$ may have the same sign during a reading process of the memory cell, whereby the active lever voltage $V_{LE,ACT}$ is still bigger than the passive lever voltage $V_{LE,PAS}$, whereby a disturb may be reduced.

As an example, to avoid disturb of a third memory cell (3) and a fourth memory cell (4) of the memory cell arrangement 300 during reading the first memory cell (1), a voltage different from the read voltage $V_G$ may be applied to a passive word-line connected to the ferroelectric capacitor of the non-selected third and fourth memory cell (3), (4). A voltage different from the read voltage $V_G$ may be applied to all passive word-lines connected to the ferroelectric capacitors of the non-selected memory cells of the memory cell arrangement 300 that do not share the same word-line WL as the first memory cell (1) (e.g., which are not connected to the first word-line WL(1)). According to various aspects, a passive word voltage $V_{FE,PAS}$ applied to the corresponding word-line (e.g., to a second word-line WL(2)) may be, for example, in the range from about the base voltage $V_{SS}$ (e.g., $V_{SS}$=0 V) to about half of the absolute of the read voltage, i.e., $0.5*|V_G|$.

According to various aspects, a voltage value of the read voltage $V_G$ and a voltage value of the passive word voltage $V_{FE,PAS}$ applied to all passive word-lines connected to the ferroelectric capacitors of the non-selected memory cells of the memory cell arrangement 300 (in the following also referred to as inhibit voltage) may be of opposite sign. For example, the read voltage $V_G$ may have a positive voltage value and the passive word voltage $V_{FE,PAS}$ may have a negative voltage value, or vice versa. More preferably, the read voltage $V_G$ and the passive word voltage $V_{FE,PAS}$ may be of opposite sign, but the absolute values may be equal or at least may be nearly equal, which is beneficial for the writing process.

Further, to avoid disturb of additional memory cells which are not connected to the active bit-line (not shown in FIGS. 3A-3C) of the memory cell arrangement 300 during reading the first memory cell (1), a base voltage $V_{SS}$ or a voltage close to the base voltage may be applied to the corresponding passive bit-lines connected to the field-effect transistor of the additional non-selected memory cells that are not connected to the active bit-line (not shown). A voltage that is equal to the base voltage $V_{SS}$ or that is close to the base voltage $V_{SS}$ may be applied to all passive bit-lines connected to the field-effect transistors of the additional non-selected memory cells of the memory cell arrangement 300 that do not share the same bit-line BL as the first memory cell (1). In this case, a passive base voltage $V_{BL,PAS}$ applied to the corresponding passive bit-lines may be, for example, $V_{BL,}$ $_{PAS}$=0 V or a voltage close to 0 V (e.g., a voltage in the range from about −0.25 V to about +0.25 V).

As described exemplarily above, individual cells of the memory cell arrangement 300 can be read. It is noted that some or all of the voltages described are only examples and that deviations from the described voltages may be possible.

According to various aspects, the third control node and the fourth control node of the memory cells 100 (that may include semiconductor material) may be kept at the base voltage $V_{SS}$ but the potential of the active bit-line (e.g., the active bit voltage $V_{BL,ACT}$) may be charged to a potential greater than $V_{SS}$ to detect a charge created by the ferroelectric capacitor.

According to various aspects, a memory cell is described herein may include (e.g. may consist of) one transistor and two capacitors, one of the two capacitors being a ferroelectric capacitor. By increasing the capacitance of the capacitor which does not exhibit the ferroelectric charge (e.g., the lever capacitor), a program voltage can be obtained that is close to a program voltage of a standalone ferroelectric capacitor. During read, the voltage distribution may be changed (compared to writing) such that a disturbance of the ferroelectric material in the ferroelectric capacitor can be avoided and such that a good control over the transistor (e.g., a MOS transistor) can be obtained. During retention condition, the voltage over the ferroelectric material can be reduced to avoid depolarization of the ferroelectric portion.

According to various aspects, an AND architecture is described herein to organize the 1T2C memory cell into an array structure to build memory arrays. By tuning the voltages applied on both capacitors, a disturbance during read and write can be reduced effectively. For write inhibition, junction leakages may be avoided, since all semiconductor terminals can be kept at ground. The structure allows bit-alterability for long channel transistors. According to various aspects, another memory element may be used instead of the ferroelectric capacitor, if desired. According to various aspects, another transistor may be used instead of the field-effect transistor, if desired.

According to various aspects, the lever capacitor may (or the second capacitor structure) may be configured such that it has a capacitance in the range from about 0.01 fF to about 100 fF, 0.1 fF to about 10 fF. However, the capacitance of the lever capacitor may be adapted to the other elements of the memory cell as desired.

In the following a layout of a memory cell will be described. At first, a single memory cell is described with reference to FIG. 4A. Afterwards, the single memory cell may be incorporated into a memory cell arrangement. The single memory cell within the array will be presented with reference to FIG. 4B and the memory cell arrangement will be described with reference to FIG. 4C.

Figure 4A:
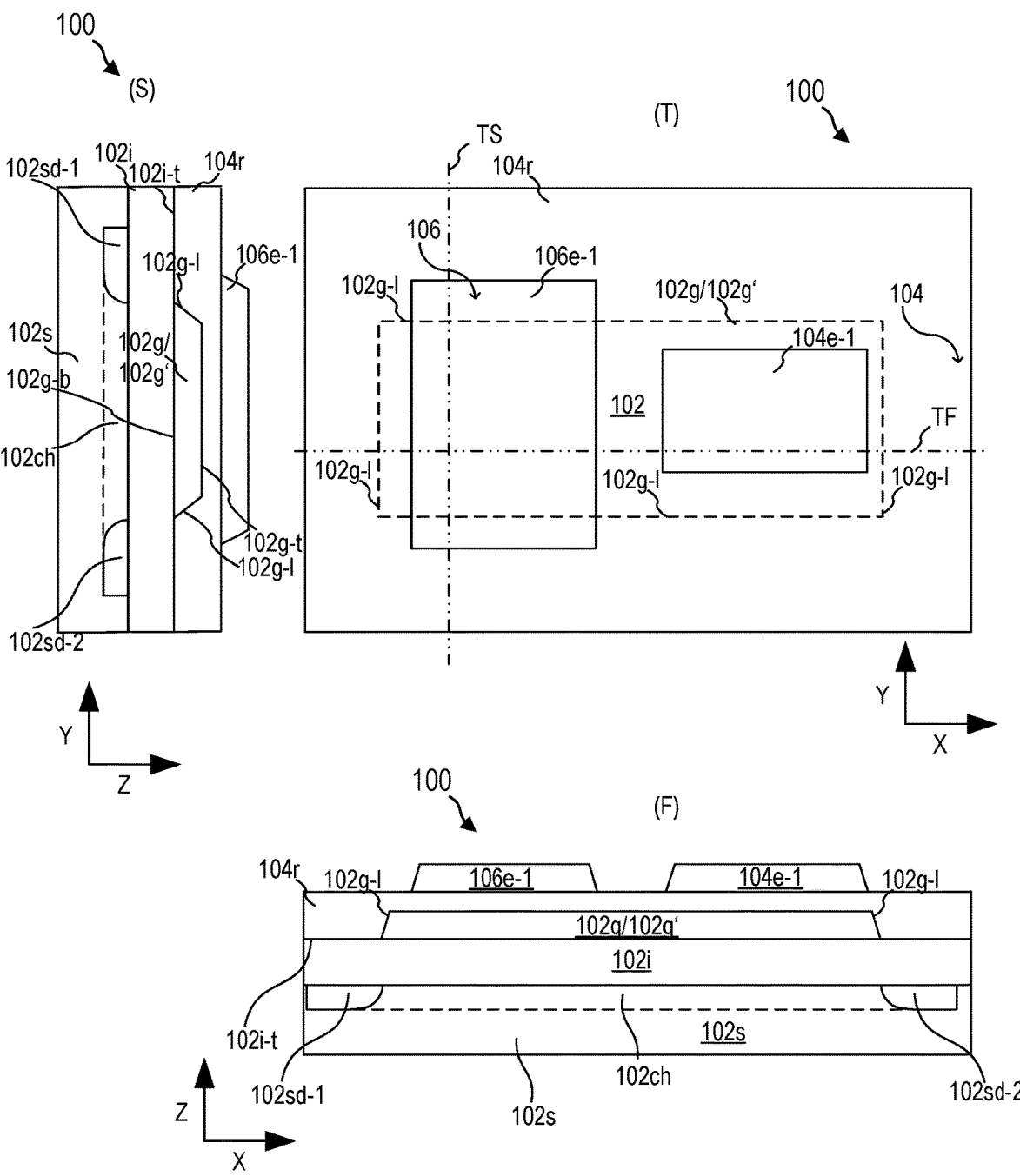
FIGS. 4A-4C schematically show a memory cell arrangement and layouts thereof, according to various aspects.

In FIG. 4A different views of a memory cell 100 according to various aspects are shown. The right part of FIG. 4A shows a top view (T) of the memory cell according to various aspects, which may be located in an X-Y-plane. The left part of FIG. 4A shows a first lateral view (S) (also referred to as side-view) of the memory cell in a Z-Y-plane along the double-dot-dashed line TS depicted in the top view (T). The lower part of FIG. 4A shows a second lateral view (F) (also referred to as front-view) of the memory cell in a X-Z-plane along the double-dot-dashed line TF depicted in the top view (T). It is understood, that the X-Y-plane, X-Z-plane and the Z-Y plane are all perpendicular to each other.

The memory cell 100 may comprise all the structures, which are described before. Briefly, the memory cell 100 may comprise a first capacitive structure 104, a second capacitive structure 106 and a field effect transistor structure 102, as described before. In the top view (T) only respective first electrodes of the first capacitive structure 104 and the second capacitive structure 106 can be seen. The gate electrode 102g of the field effect transistor structure 102 is shown as a dashed line, since it is hidden beneath the memory layer 104r. Basically, the shown memory cell is similar to the memory cell, which was already described with respect to FIG. 1C. Therefore, the same reference numbers were used. However, in contrast to the memory cell of FIG. 1C, the first capacitive structure 104 and the second capacitive structure 106 share a same layer, which is located between the respective electrodes of the first capacitive structure 104 and the second capacitive structure 106, respectively. This may be seen in more detail in the first and the second lateral view (S), (F).

In the first lateral view (S) a layered structure of the memory cell 100 according to various aspects may be seen. In more detail, the second lateral view (S) shows a cross-sectional view through the second capacitive structure 106. The single layers and the corresponding structures were explained in detail before with respect to FIG. 1C. However, it may be seen, the gate electrode 102g of the field effect transistor structure 102, the first electrode 106e-1 of the second capacitive structure 106 and the memory layer 104r of the first capacitive structure 104 together form the second capacitive structure 106.

This may be also seen in the second lateral view (T), where another cross-sectional view of the memory cell 100 through the first and the second capacitive structure may be seen. Again it can be seen that the second capacitive structure 106 is formed by the first electrode 106e-1 of the second capacitive structure 106, the gate electrode 102g of the field effect transistor structure 102 as a second electrode of the second capacitive structure 106, and the memory layer 104r of the first capacitive structure 104 as an electrically isolating layer (compare also reference number 106i in FIG. 1C) located between the respective electrodes of the second capacitive structure 106. Furthermore, the first capacitive structure 104 is formed by the first electrode 104e-1 of the first capacitive structure 104, the gate electrode 102g of the field effect transistor structure 102 as a second electrode of the first capacitive structure 104, and the memory layer 104r of the first capacitive structure 104 located between the respective electrodes of the first capacitive structure 104.

According to various aspects the gate electrode 102g of the field-effect transistor structure 102 may be covered by the memory layer 104r (see (S) and (F)). One or more surfaces of the gate electrode 102g of the field-effect transistor structure 102 may be covered by the memory layer 104r such that there is no electrically conductive connection neither to the first electrode 104e-1 of the first capacitive structure 104 nor to the first electrode 106e-1 of the second capacitive structure. Therefore, the gate electrode 102g of the field-effect transistor structure 102 may be electrically floating. In other words, the gate electrode 102g of the field-effect transistor structure 102 may be referred to as a floating gate electrode 102g' (of the memory cell 100).

According to various aspects, an upper surface of the floating gate electrode may be covered by the memory layer 104r (e.g. partially or completely) to be electrically conductively insulated from the semiconductor portion 102s. One or more electrode may be covered by the memory layer 104r (e.g. partially or completely). The memory layer 104r may cover the top surface of the floating gate electrode 102g' and thereby, electrically insulating the floating gate electrode from the first electrode of the first and the second capacitive structure 104, 106, respectively. The lateral sides (e.g., all lateral sides) of the floating gate electrode 102g' may be covered by the memory layer 104r.

In the side view (S) the floating gate electrode 102g' of the first memory cell (1) is shown. The gate electrode may be coupled (e.g., capacitively coupled or electronically conductively connected) to the second electrode 106e of the second capacitor structure 106. According to various aspects, the floating gate electrode 102g' may not be electrical conductively connected to the first electrode 106e-1 of the second capacitor structure of the first memory cell. The gate electrode 102g may be electrically insulated by the memory layer the first electrode of the second capacitor structure 106. For example, the top surface and the side surfaces of the floating gate electrode 102g' may be covered by the memory layer. The floating gate electrode 102g' may be the second electrode of the second capacitor structure 106.

According to various aspects, the floating gate electrode 102g' may be capacitively coupled to the second electrode 104e-1 of the first capacitor structure 104. According to various aspects, the floating gate electrode 102g' may not be electrical conductively connected to the first electrode of the first capacitor structure 104 of the memory cell 100. The floating gate electrode 102g' may be electrically insulated by the memory layer 104r from the first electrode 104e-1 of the first capacitor structure 104. The floating gate electrode 102g' may be the second electrode of the first capacitor structure 104.

According to various aspects, the floating gate electrode 102g' may act as the secondary electrode of the first capacitor structure 104 and/or of the second capacitor structure 106, respectively. Therefore, the gate electrode 102g may be located beneath the first electrodes of the first and the second capacitor structure of the respective memory cell (shown in FIG. 4A and FIG. 4B as dashed line 104r), respectively, to form the respective capacitive structure. In other words, the respective second electrode of the first and/or second capacitive structure may be defined by a projection (e.g. along the z-axis) of the first electrode of the corresponding first and/or second capacitive structure 104, 106 onto the gate electrode 102g'. The said projection may define an active area of the gate electrode 102g' corresponding to the first capacitive structure and/or second capacitive structure 104, 106 acting as a second electrode, respectively.

According to various aspects, the gate electrode 102g may be electrically insulated from the first electrode of the first and the second capacitive structure by the memory layer 104r, respectively. Therefore, the memory layer 104r may cover the top surface and/or the side walls of the floating gate electrode 102g'. The memory layer 104r may cover one or more lateral surfaces of the floating gate electrode 102g'. For example, the memory layer 104r may cover all lateral surfaces of the floating gate electrode 102'. The floating gate electrode 102g' may be stacked on a top surface 102i-t gate isolation (layer) 102i which may electrically insulate the gate electrode 102g from the semiconductor portion 102s. The floating gate electrode 102g' may comprise one or more lateral surfaces 102g-1, a top surface (or upper surface) 102g-t, and a bottom surface 102g-b. The top surface 102g-t may be orientated along the x-axis, e.g., parallel to the x-axis. The top surface 102g-t may be orientated along the top surface 102i-t of the gate insulation 102i, e.g., parallel to the gate insulation 102i. Each surface of the one or more lateral surfaces 102g-1 may be orientated essentially along the z-axis, respectively. In FIG. 4A the one or more lateral surfaces 102g-1 of the floating gate electrode 102g' are shown being inclined with respect to the top surface $102i$-$t$ of the gate insolation $102i$. It is understood that other directions may be possible, too: perpendicular to the top surface $102i$-$t$ of the gate insolation $102i$, curved, stepped, or any other shape which may be preferable for and/or which may result from processing the floating gate electrode $102g'$ and/or any subsequent structures. Furthermore, the one or more lateral surfaces $102g$-$1$ of the floating gate electrode $102g'$ may enclose the gate electrode, when viewed from a top view, e.g. along the z-axis. For example, a first surface of the one or more lateral surfaces $102g$-$1$ of the floating gate electrode $102g'$ may be orientated parallel to a second lateral surfaces $102g$-$1$ of the one or more lateral surfaces $102g$-$1$ of the floating gate electrode $102g'$, e.g. viewed along the z-axis. A first surface of the one or more lateral surfaces $102g$-$1$ of the floating gate electrode $102g'$ may be orientated perpendicular to a third lateral surfaces $102g$-$1$ of the one or more lateral surfaces $102g$-$1$ of the floating gate electrode $102g'$, e.g. viewed along the z-axis.

According to various aspects the memory cell 100 includes the field-effect transistor structure. In FIG. 4A one exemplary type of field-effect transistor is depicted and it was exemplarily described before. It is understood from those skilled in the art that the type of field effect transistor used in the memory cell 100 is not limited to that special type of field-effect transistor. Any type of known field-effect transistor may be used, and therefore, may be comprised in the field-effect transistor structure, e.g., a metal-oxide-semiconductor field-effect transistor (MOSFET), an insulated-gate bipolar transistor (IGBT), a metal-nitride-oxide-semiconductor transistor (MNOS), gate-all-around FET (GAAFET), a fin field-effect transistor (finFET), or any other type of field-effect transistor. Since the actual type of the selected field-effect transistor is not important, it may not be shown in the following drawings to ease the understanding.

As described before, a memory cell 100 may be comprised in a memory cell arrangement. In the following, a memory arrangement 400 will be presented. The memory arrangement may include a plurality of memory cells 100 which are similar to the memory cell 100 described with respect to FIG. 4A. Furthermore, a memory cell arrangement 400 may include a plurality of control lines as described before, e.g., a first word-line WL(1), a second word-line WL(2), a first lever-line LL(1), a second-lever line LL(2). Briefly, the first and the second word-lines WL(1), WL(2), may be each connected to the respective gate nodes of one or more memory cells of the memory arrangement 400. The first and the second lever-lines LL(1), LL(2), may be each connected to the respective lever nodes of one or more memory cells of the memory arrangement 400.

Figure 4B:
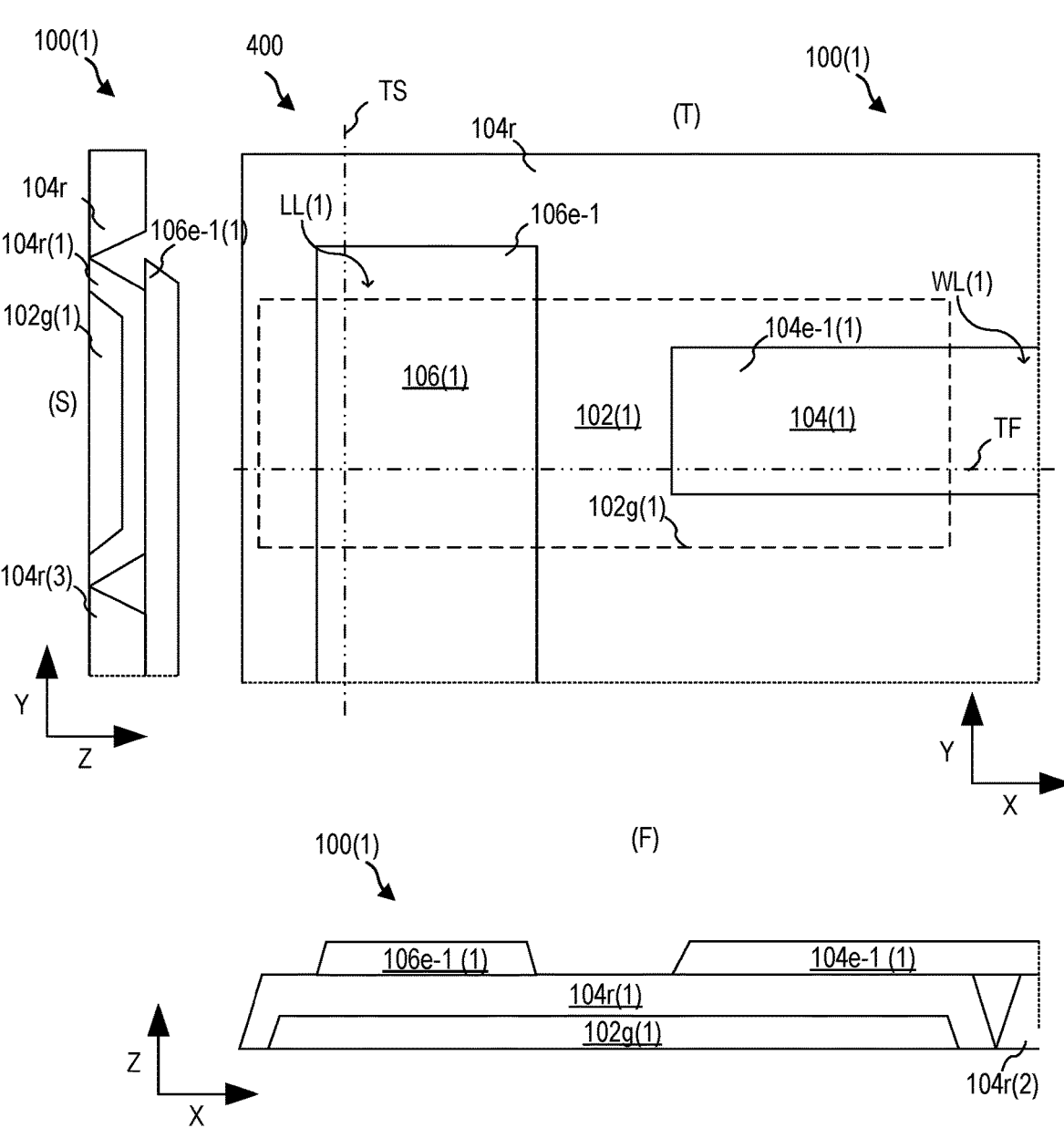

FIG. 4B shows a first memory cell 100(1) of the plurality of memory cells of the memory cell arrangement 400 from a top view (T), a first lateral view (S) and a second lateral view (F). The components are similar to the components described with respect to FIG. 4A, even though a (1) was added to the reference numerals to emphasize the correspondence to the first memory cell 100(1). However, the shown memory cell is only a part of the memory cell arrangement 400, which may be continued after the dotted lines.

The first electrode 104e-1 of the first capacitor structure 104(1) of the first memory cell 100(1) may be a part of the first word-line WL(1). For example, a projection of the gate electrode 102g(1) of the first field-effect transistor structure 102(1) of the first memory cell 100(1) onto the first word-line WL(1) along the z-axis may define a first active area of the first word-line WL(1). The first active area of the first word-line WL(1) may act as a first electrode 104e-1(1) of the first capacitive structure 104 of the first memory cell 100(1). It may also be possible, that the first word-line WL(1) may be connected via a via or any other electrically conductive connection to a separate first electrode 104e-1(1) of the first capacitive structure 104 of the first memory cell 100(1).

Furthermore, the first electrode 106e-1 of the second capacitor structure 106(1) of the first memory cell 100(1) may be a part of the first lever-line LL(1). For example, a projection of the gate electrode 102g(1) of the first field-effect transistor structure 102(1) of the first memory cell 100(1) onto the first lever-line LL(1) may define a first active area of the first lever-line LL(1). The first active area of the first lever-line LL(1) may act as a first electrode 106e-1(1) of the second capacitive structure 106 of the first memory cell 100(1). It may also be possible, that the first lever-line LL(1) may be connected via a via or any other electrically conductive connection to a separate first electrode 106e-1(1) of the second capacitive structure 106 of the first memory cell 100(1).

As it may be seen the memory layer 104r may be separated between adjacent memory cells, e.g., via a trench. This is just exemplarily shown in FIG. 4B. For example, this separation may be a result of a deposition step of depositing the memory layer 104r. It is understood, since the memory layer 104r is electrically insulating, that no specific separation between the memory layer 104r of adjacent memory cells 100 is needed.

Figure 4C:
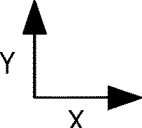

FIG. 4C shows a schematic layout of the memory cell arrangement 400 according to various aspects. According to various aspects, the memory cell arrangement 400 may include a plurality of memory cells as described before. The first memory cell 100(1) was already shown in FIG. 4B. The plurality of memory cells may further comprise a second memory cell 100(2), a third memory cell 100(3) and a fourth memory cell 100(4). Each of the plurality of memory cells may be similar to the first memory cell 100(1) or any other memory cell 100 described herein.

According to various aspects the memory cells of the memory cell arrangement 400 may be arranged in a matrix shape, e.g. in rows and columns.

Memory cells 100 which are adjacent in a first direction, e.g. memory cells in the same row, may be connected to the same word-line. For example, the first memory cell 100(1) and the second memory cell 100(2) may be connected to the first word-line WL(1) and the third memory cell 100(3) and the fourth memory cell 100(4) may be connected to the second word-line WL(2). Each memory cell of the memory cell arrangement 400 may be connected to its corresponding word-line WL similar as the first memory cell 100(1) is connected to the first word-line WL(1).

Memory cells 100 which are adjacent in a second direction, e.g. memory cells in the same column, may be connected to the same lever-line. For example, the first memory cell 100(1) and the third memory cell 100(3) may be connected to the first lever-line LL(1) and the second memory cell 100(2) and the fourth memory cell 100(4) may be connected to the second lever-line LL(2). Each memory cell of the memory cell arrangement 400 may be connected to its corresponding lever-line WL similar as the first memory cell 100(1) is connected to the first lever-line LL(1).

This arrangement allows an effective processing, e.g., separate metallization layers, and/or separate vias, and/or separate insulating layers may be omitted. Therefore, an overall process time for producing the memory arrangement 400 may be reduced. Furthermore, an access speed to the memory cells may be improved since less junction between separate components may lead to less parasitic resistances and less parasitic capacitances in the memory cells.

In the following, various examples are provided that may include one or more aspects described above with reference to the memory cell, the memory cell arrangement 200, the memory cell arrangement 300, the and memory cell arrangement 400. It may be intended that aspects described in relation to the memory cell, the memory cell arrangements 200, 300, 400 may apply also to corresponding methods, and vice versa.

Example 1 is a memory cell which may comprise: a field-effect transistor structure comprising a gate structure, the gate structure comprising a floating gate electrode separated from a channel of field-effect transistor structure by a gate isolation; a spontaneously polarizable memory layer, wherein the spontaneously polarizable memory layer covers completely an upper surface of the floating gate electrode and wherein the spontaneously polarizable memory layer covers one or more lateral surfaces of the floating gate electrode; a gate electrode, wherein the spontaneously polarizable memory layer is disposed between the floating gate electrode and the gate electrode to form a capacitive memory structure; and a lever electrode, wherein the spontaneously polarizable memory layer is disposed between the floating gate electrode and the lever electrode to form a lever structure.

In Example 2 the memory cell according to Example 1 may further include that the field-effect transistor structure of the memory cell further may comprise a first source/drain region, a second source/drain region and a channel region extending from the first source/drain region to the second source/drain region, that the respective floating gate electrode may be disposed adjacent to the channel region to control one or more electrical properties thereof.

In Example 3 the memory cell according to Example 2 may further include that the first source/drain region may be a portion of a source line or may be connected to a source line.

In Example 4 the memory cell according to Example 2 or 3 may further include that the second source/drain region is a portion of a bit-line or is connected to a bit-line.

In Example 5 the memory cell according to any of the Examples 2 to 4 may further include that the lever electrode may be a portion of a common lever electrode associated with a plurality of neighboring memory cells; and/or wherein the lever electrode may be a portion of a lever-line.

In Example 6 the memory cell according to any of the Examples 2 to 5 may further include that the gate electrode may be a portion of a common gate electrode associated with a plurality of neighboring memory cells; and/or wherein the gate electrode of the memory cell may be a portion of a word-line.

In Example 7 the memory cell according to any of the Examples 2 to 6 may further include that the field-effect transistor structure further comprises a source contact and a drain contact, that the drain contact is electrically conductive connected to the first source/drain region, and that the source contact is electrically conductive connected to the second source/drain region.

In Example 8 the memory cell according to the Example 7 may further include that the first source/drain region and the second source/drain region are buried source/drain regions, respectively.

In Example 9 the memory cell according to the Example 7 or 8 may further include that the memory cell is configured such that a gate/source voltage applied between the gate electrode and the source contact is divided into: a gate/ floating-gate voltage drop between the gate electrode and the floating gate electrode, and a floating-gate/source voltage drop between the floating gate electrode and the source contact in accordance with the capacities of the capacitive memory structure and the field-effect transistor structure.

In Example 10 the memory cell according to any of the Examples 7 to 9 may further include that the memory cell is configured such that a gate/drain voltage applied between the gate electrode and the drain contact is divided into: a gate/floating-gate voltage drop between the gate electrode and the floating gate electrode, and a floating-gate/drain voltage drop between the floating gate electrode and the drain contact in accordance with the capacities of the capacitive memory structure and the field-effect transistor structure.

In Example 11 the memory cell according to any of the Examples 7 to 10 may further include that the memory cell is configured such that a lever/source voltage applied between the gate electrode and the source contact is divided into: a lever/floating-gate voltage drop between the lever electrode and the floating gate electrode, and a floating-gate/source voltage drop between the floating gate electrode and the source contact in accordance with the capacities of the capacitive lever structure and the field-effect transistor structure.

In Example 12 the memory cell according to any of the Examples 7 to 11 may further include that the memory cell is configured such that a lever/drain voltage applied between the gate electrode and the drain contact is divided into: a lever/floating-gate voltage drop between the lever electrode and the floating gate electrode, and a floating-gate/drain voltage drop between the floating gate electrode and the drain contact in accordance with the capacities of the capacitive lever structure and the field-effect transistor structure.

In Example 13 the memory cell according to any of the Examples 7 to 12 may further include that the spontaneously polarizable memory layer comprises a remanent-polarizable layer.

In Example 14 the memory cell according to any of the Examples 1 to 13 may further include that the gate electrode of the capacitive memory structure may be a top electrode, wherein the lever electrode of the lever structure may be a top electrode, and wherein the top electrode of the first capacitive memory structure and the top electrode of the first capacitive lever structure may be electrically separated from one another to allow an individual addressing of the first capacitive lever structure and the first capacitive memory structure, receptively.

Example 15 is a memory cell arrangement, which may comprise: a first memory cell according to any one of the Examples 1 to 14 and a second memory cell according to any one of the Examples 1 to 14.

In Example 16 the memory cell arrangement according to Example 15 may further include that the lever electrode of the first memory cell and the lever electrode of the second memory cell are a portion of a common lever-line.

In Example 17 the memory cell arrangement according to Example 15 may further include that the gate electrode of the first memory cell and the gate electrode of the second memory cell are a portion of a common word-line.

In Example 18 the memory cell arrangement according to any of the Examples 15 to 17 may optionally further include a third memory cell according to any one of the Examples 1 to 14.

In Example 19 the memory cell arrangement according to Example 18 may further include that the gate electrode of the first memory cell and the gate electrode of the third memory cell are a portion of a common word-line.

In Example 20, the memory cell arrangement according to any of the Examples 15 to 19 may optionally further include that the first memory cell and the second memory cell are adjacent to one another.

In Example 21, the memory cell arrangement according to any of the Examples 15 to 20 may optionally further include that the first memory cell is part of a set of memory cells provided in a first memory cell row and that the second memory cell is part of a set of memory cells provided in a second memory cell row, where the first memory cell row runs parallel to the second memory cell row and wherein the first memory cell row and the second memory cell row are adjacent to one another.

Example 22 is a memory cell arrangement which may comprise: a plurality of memory cells each comprising a field-effect transistor structure comprising a gate structure, the gate structure comprising a floating gate electrode separated from a channel of field-effect transistor structure by a gate isolation, a spontaneously polarizable memory layer, wherein the spontaneously polarizable memory layer covers completely an upper surface of the floating gate electrode and wherein the spontaneously polarizable memory layer covers one or more lateral surfaces of the floating gate electrode, a gate electrode, wherein the spontaneously polarizable memory layer is disposed between the floating gate electrode and the gate electrode to form a capacitive memory structure, and a lever electrode, wherein the spontaneously polarizable memory layer is disposed between the floating gate electrode and the lever electrode to form a lever structure.

In Example 23 the memory cell arrangement according to Example 22 may further include that the plurality of memory cells may be arranged in a matrix arrangement defined by rows and columns such that each memory cell may be individually represented (e.g., identified) by its corresponding row and column.

In Example 24 the memory cell arrangement according to Example 23 may optionally include that the matrix arrangement may include M columns and N rows to provide an M times N matrix arrangement. Both, M and N, may be natural numbers, wherein M≥1, N≥1, and M+N>2.

In Example 25 the Memory cell arrangement according to Example 23 or 24 may further include that the gate electrodes of adjacent memory cells of the plurality of memory cells disposed in the same row may be electronically and/or physically connected to form a portion of a word-line to address the memory cells of the respective row.

In Example 26 the Memory cell arrangement according to any of the Examples 23 to 25 may further include that the lever electrodes of adjacent memory cells of the plurality of memory cells may be disposed in the same column are connected to form a portion of a lever-line to address the memory cells of the respective column.

In Example 27 the memory cell arrangement according to Example 22 may optionally further include that a first memory cell of the plurality of memory cells and a second memory cell of the plurality of memory cells are adjacent to one another.

In Example 28 the memory cell arrangement according Example 22 may optionally further include that a first memory cell of the plurality of memory cells is part of a set of memory cells provided in a first memory cell row and that a second memory cell of the plurality of memory cells is part of a set of memory cells provided in a second memory cell row, where the first memory cell row runs parallel to the second memory cell row and wherein the first memory cell row and the second memory cell row are adjacent to one another.

In Example 29 the memory cell arrangement according to any of the Examples 22 to 28, wherein the gate electrodes of the memory cells of the plurality of memory cells correspond to a first subset of memory cells and wherein the said gate electrodes may be a portion of a word-line of the set of word-lines.

In Example 30 the memory cell arrangement according to any of the Examples 22 to 29 may further include that the lever electrodes of the memory cells of the plurality of memory cells correspond to a second subset of memory cells and wherein the said lever electrodes may be a portion of a lever-line of the set of lever-lines.

In Example 31 the memory cell arrangement according to any one of the Examples 22 to 30 may further include that the plurality of memory cells may be arranged in a matrix.

In Example 32 the memory cell arrangement according to any of the Examples 23 to 26, or according to any of the Examples 27 to 32 in connection with Example 23 may further include that the memory cells of the plurality of memory cells which are arranged in the same column are addressed by the same lever-line.

In Example 33 the memory cell arrangement according to any of the Examples 23 to 26, or according to any of the Examples 27 to 32 in connection with Example 23, or according to Example 32 may further include that the plurality of memory cells which are arranged in the same column belong to the first subset of memory cells.

In Example 34 the memory cell arrangement according to any of the Examples 23 to 26, or according to any of the Examples 27 to 31 in connection with Example 23, or according to Example 32 or 33 may further include that the memory cells of the plurality of memory cells which are arranged in the same row are addressed by the same word-line.

In Example 35 the memory cell arrangement according to any of the Examples 23 to 26, or according to any of the Examples 27 to 32 in connection with Example 23, or according to any of the Examples 32 to 34 may further include that more preferable the plurality of memory cells which are arranged in the same row belong to the second subset of memory cells.

In Example 30 the memory cell arrangement according to Example 22 may further include that a first subset of memory cells of the plurality of memory cells may share a common gate electrode.

In Example 37 the memory cell arrangement according to Example 22 or 36 may further include that a second subset of memory cells of the plurality of memory cells may share a common lever electrode.

Example 38 is a memory cell arrangement which may comprise: a plurality of memory cells, each memory cell of the plurality of memory cells comprising a first source/drain terminal, a second source/drain terminal, a gate terminal, and a lever terminal; a first source line, a second source line, a bit-line, a first word-line, a second word-line, a first lever-line, and a second lever-line to address a first memory cell, a second memory cell, a third memory cell, and a fourth memory cell of the plurality of memory cells; wherein the first source/drain terminal of the first memory cell and the first source/drain terminal of the second memory cell are electrically conductively connected to one another via a first source line, wherein the first source/drain terminal of the third memory cell and the first source/drain terminal of the fourth memory cell are electrically conductively connected to one another via the second source line, wherein the second source/drain terminal of the first memory cell, the second source/drain terminal of the second memory cell, the second source/drain terminal of the third memory cell, and the second source/drain terminal of the fourth memory cell are electrically conductively connected to one another via the bit-line, wherein the gate terminal of the first memory cell and the gate terminal of the second memory cell are electrically conductively connected to one another via the first word-line, wherein the gate terminal of the third memory cell and the gate terminal of the fourth memory cell are electrically conductively connected to one another via the second word-line, wherein the lever terminal of the first memory cell and the lever terminal of the third memory cell are electrically conductively connected to one another via the first lever-line, and wherein the lever terminal of the second memory cell and the lever terminal of the fourth memory cell are electrically conductively connected to one another via the second lever-line.

In Example 39 the memory cell arrangement according to Example 38 may further include that each memory cell of the plurality of memory cells may optionally further comprise a field-effect transistor structure, respectively, and wherein the field-effect transistor structure may comprise a first source/drain region which is electrically conductively connected to the first source/drain terminal and a second source/drain region which is electrically conductively connected to the second source/drain terminal and a field-effect transistor (FET)-gate electrode which is coupled (e.g., capacitively coupled or electronically conductively connected) to the gate terminal and to the lever terminal.

In Example 40 the memory cell arrangement according to Example 39 may further include that the FET-gate electrode of the field-effect transistor structure of each memory cell of the plurality of memory cells may be a floating gate electrode.

In Example 41 the memory cell arrangement according to any one of the Examples 38 to 40 may further include that each memory cell of the plurality of memory cells may optionally further comprise a respective capacitive memory structure comprising a first electrode, a second electrode, and a spontaneously polarizable memory layer located between the first electrode and the second electrode, and may include that the first electrode of the respective capacitive memory structure may be electrically conductively connected to the gate terminal or that the gate terminal and the first electrode are provided by a common gate terminal electrode.

In Example 42 the memory cell arrangement according to Example 41 may further include that the second electrode of the respective capacitive memory structure may be electrically conductively connected to or may be the FET-gate electrode of the corresponding field-effect transistor structure of the respective memory cell of the plurality of memory cells.

In Example 43 the memory cell arrangement according to Example 41 or 42 may further include that the spontaneously polarizable memory layer of the respective capacitive memory structure of the corresponding memory cell of the plurality of memory cells may comprise (e.g., may be) a remanent-polarizable layer.

In Example 44 the memory cell arrangement according to any one of the Examples 38 to 43 may further include that each memory cell of the plurality of memory cells may optionally further comprise a respective lever structure comprising a first lever electrode, a second lever electrode, and an insulating lever layer located between the first lever electrode and the second lever electrode and may further include that the first lever electrode of the respective lever structure may be electrically conductively connected to the lever terminal or that the lever terminal and the first lever electrode may be provided by a common lever terminal electrode.

In Example 45 the memory cell arrangement according to Example 44 may further include that the insulating lever layer of the respective lever structure of each of the memory cells of the plurality of memory cells may comprise a spontaneously polarizable layer or may be a spontaneously polarizable layer, and whereby more preferably said insulating layer may comprise (e.g., may be) a remanent-polarizable layer.

In Example 46 the memory cell arrangement according to Example 44 or 45 may further include that the insulating lever layer of the respective lever structure of each of the memory cells of the plurality of memory cells may comprise (e.g., may be) a dielectric layer.

In Example 47 the memory cell arrangement according to any one of the Examples 44 to 46 may further include that wherein the second lever electrode of the respective lever structure may be electrically conductively connected to or may be the FET-gate electrode of the corresponding field-effect transistor structure of the respective memory cell of the plurality of memory cells.

In Example 48 the memory cell according to Example 47 may further include that the first lever electrode of the respective lever structure may be electrically conductively connected to or may be the lever terminal, and wherein the second lever electrode of the respective memory structure may be electrically conductively connected to or may be the FET-gate electrode of the corresponding field-effect transistor structure of the respective memory cell of the plurality of memory cells.

In Example 49 the memory cell arrangement according to Example 38 may further include that each memory cell of the plurality of memory cells may optionally further comprise a respective capacitive memory structure comprising a first electrode, a second electrode, and a spontaneously polarizable memory layer located between the first electrode and the second electrode.

In Example 50 the memory cell arrangement according to Example 49 may further include that the first electrode of the respective capacitive memory structure may be electrically conductively connected to the gate terminal or that the gate terminal and the first electrode are provided by a common gate terminal electrode, and may further include that the second electrode of the respective capacitive memory structure may be coupled to the first source/drain terminal and to the second source/drain terminal of the corresponding memory cell.

In Example 51 the memory cell arrangement according to Example 49 or 50 may further include that the spontaneously polarizable memory layer of the respective capacitive memory structure of the corresponding memory cell of the plurality of memory cells may comprise (e.g., may be) a remanent-polarizable layer.

In Example 52 the memory cell arrangement according to Example 38 or according to any of the Examples 49 to 51 may further include that each memory cell of the plurality of memory cells may optionally further comprise a respective lever structure comprising a first lever electrode, a second lever electrode, and an insulating layer located between the first lever electrode and the second lever electrode.

In Example 53 the memory cell arrangement according to Example 52 may further include that the first lever electrode of the respective capacitive memory structure may be electrically conductively connected to or may be the lever terminal, and may further include that the second lever electrode of the respective lever structure may be capacitively coupled to the first source/drain terminal and to the second source/drain terminal of the corresponding memory cell.

In Example 54 the memory cell arrangement according to Example 52 or 53 may further include that the insulating layer of the respective capacitive memory structure of each memory cell of the plurality of memory cells may comprise (e.g., may be) a spontaneously polarizable memory layer.

In Example 55 is the memory cell arrangement according to Example 54 may further include that the insulating layer of the respective capacitive memory structure of each memory cell of the plurality of memory cells may comprise (e.g., may be) a remanent-polarizable layer.

In Example 56 is the memory cell arrangement according to any one of the Examples 52 to 55 may further include that the insulating layer of the respective capacitive memory structure of each memory cell of the plurality of memory cells may comprise (e.g., may be) a dielectric memory layer.

Example 57 is a memory cell arrangement, which may comprise: a plurality of memory cells, each memory cell of the plurality of memory cells comprising a first terminal, a second terminal, a third terminal, and a fourth terminal, a first control line, a second control line, a third control line, a fourth control line, a fifth control line, a sixth control line, and a seventh control line to address a first memory cell, a second memory cell, a third memory cell, and a fourth memory cell of the plurality of memory cells; wherein the first terminal of the first memory cell and the first terminal of the second memory cell are electrically conductively connected to one another via the first control line, wherein the first terminal of the third memory cell and the first terminal of the fourth memory cell are electrically conductively connected to one another via the second control line, wherein the second terminal of the first memory cell, the second terminal of the second memory cell, the second terminal of the third memory cell and the second terminal of the fourth memory cell are electrically conductively connected to one another via the third control line; wherein the third terminal of the first memory cell and the third terminal of the second memory cell are electrically conductively connected to one another via the fourth control line; wherein the third terminal of the third memory cell and the third terminal of the fourth memory cell are electrically conductively connected to one another via the fifth control line; wherein the fourth terminal of the first memory cell and the fourth terminal of the third memory cell are electrically conductively connected to one another via the sixth control line; and wherein the fourth terminal of the second memory cell and the fourth terminal of the fourth memory cell are electrically conductively connected to one another via the seventh control line.

In Example 58 the memory cell arrangement according to Example 57 may further include that the first terminal of each memory cell of the plurality of memory cells may be a first source/drain terminal; wherein the second terminal of each memory cell of the plurality of memory cells may be a second source/drain terminal, wherein the third terminal of each memory cell of the plurality of memory cells is a gate terminal; and wherein the fourth terminal of each memory cell of the plurality of memory cells is a lever terminal.

In Example 59 the memory cell arrangement according to Example 57 or 58 may further include that the first control line may be a first source line, the second control line may be a second control line, the third control line may be a bit-line, the fourth control line may be a first word-line, the fifth control line may be a second word-line, the sixth control line may be a first lever-line, and the seventh control line may be a second lever-line.

Example 60 is a memory cell arrangement according to any memory cell arrangement described in the aforementioned that may further optionally include a control circuit. The control circuit may be configured to control each of the memory cells of the memory cell arrangement according to an operation mode selected out of a plurality of operation modes. The plurality of operation modes may comprise a programming mode (e.g., a writing mode and/or an erasing mode), and/or a reading mode, and/or, one or more passive modes (e.g., a data retention mode).

In Example 61 the memory cell arrangement according to Example 60 may further include that the control circuit may be configured to control each of the memory cells of the memory cell arrangement according to a first operation mode and a second operation mode, wherein a first set of operating voltages is associated with the first operation mode and wherein a second set of operating voltages is associated with the second operation mode, wherein the first set of operating voltages includes a first lever voltage applied to a selected memory cell and wherein the second set of operating voltages includes a second lever voltage different from the first lever voltage applied to a selected memory cell. In some aspects, the lever voltage applied to selected and/or unselected memory cells may vary as a function of the respectively applied operation mode. This may allow to operate the memory cell arrangement under voltage conditions for the memory cells that are adapted to the desired type of operation, e.g., a writing operation may be more reliable by applying a respective lever voltage and a reading may be more reliable by applying another respective lever voltage.

What is claimed is:

1. A memory cell comprising:
a field-effect transistor structure comprising a gate structure, the gate structure comprising a floating gate electrode separated from a channel of field-effect transistor structure by a gate isolation;
a spontaneously polarizable memory layer, wherein the spontaneously polarizable memory layer directly contacts at least a portion of an upper surface of the floating gate electrode;
a gate electrode, wherein the spontaneously polarizable memory layer is disposed between the floating gate electrode and the gate electrode to form a capacitive memory structure; and
a lever electrode, wherein an insulating layer is disposed between the floating gate electrode and the lever electrode to form a capacitive lever structure.

2. The memory cell according to claim 1,
wherein the field-effect transistor structure of the memory cell further comprises a first source/drain region, a second source/drain region and a channel region extending from the first source/drain region to the second source/drain region, and
wherein the floating gate electrode is disposed adjacent to the channel region to control one or more electrical properties thereof.

3. The memory cell according to claim 2,
wherein the first source/drain region is a portion of a source line or is connected to a source line.

4. The memory cell according to claim 2,
wherein the second source/drain region is a portion of a bit-line or is connected to a bit-line.

5. The memory cell according to claim 1,
wherein the lever electrode is a portion of a common lever electrode associated with a plurality of neighboring memory cells; and/or
wherein the lever electrode is a portion of a lever-line.

6. The memory cell according to claim 1,
wherein the gate electrode is a portion of a common gate electrode associated with a plurality of neighboring memory cells; and/or
wherein the gate electrode of the memory cell is a portion of a word-line.

7. The memory cell of claim 2,
wherein the field-effect transistor structure further comprises a source contact and a drain contact,
wherein the drain contact is electrically conductive connected to the first source/drain region, and
wherein the source contact is electrically conductive connected to the second source/drain region.

8. The memory cell according to claim 7,
wherein the first source/drain region and the second source/drain region are buried source/drain regions, respectively.

9. The memory cell of claim 7,
wherein the memory cell is configured as a voltage divider which divides voltages applied to the gate-contact and/or to the lever contact and the source contact and/or the drain contact are divided into:
a gate/floating-gate voltage drop between the gate electrode and the floating gate electrode, and/or
a lever/floating-gate voltage drop between the lever electrode and the floating gate electrode, and/or
a floating-gate/drain voltage drop between the floating gate electrode and the drain contact, and/or
a floating-gate/source voltage drop between the floating gate electrode and the source contact in accordance with the capacities of the capacitive lever structure, the capacitive memory structure and the field-effect transistor structure.

10. The memory cell of claim 1,
wherein the spontaneously polarizable memory layer comprises a remanent-polarizable layer.

11. The memory cell arrangement according to claim 1,
wherein the insulating layer disposed between the floating gate electrode and the lever electrode is a spontaneously polarizable layer.

12. The memory cell according to claim 1, wherein the floating gate electrode is configured to act as a shared electrode for the capacitive memory structure and for the capacitive lever structure.

13. The memory cell according to claim 1, wherein the insulating layer directly contacts at least a portion of an upper surface of the floating gate electrode.

14. The memory cell according to claim 13, wherein the insulating layer is a spontaneously polarizable layer.

15. The memory cell according to claim 13, wherein the insulating layer and the spontaneously polarizable memory layer are the same material.

16. The memory cell according to claim 15, wherein the spontaneously polarizable memory layer comprises the insulating layer such that the spontaneously polarizable memory layer directly contacts at least a portion of the gate electrode and at least a portion of the lever electrode and at least a portion of the upper surface of the floating gate electrode.

17. A memory cell arrangement, comprising:
a plurality of memory cells, wherein at least one memory cell of the plurality of memory cells is configured as the memory cell of claim 1, wherein each memory cell of the plurality of memory cells comprises a first source/drain terminal, a second source/drain terminal, a gate terminal, and a lever terminal;
a first source line, a second source line, a bit-line, a first word-line, a second word-line, a first lever-line, and a second lever-line to address a first memory cell, a second memory cell, a third memory cell, and a fourth memory cell of the plurality of memory cells;
wherein the first source/drain terminal of the first memory cell and the first source/drain terminal of the second memory cell are electrically conductively connected to one another via the first source line,
wherein the first source/drain terminal of the third memory cell and the first source/drain terminal of the fourth memory cell are electrically conductively connected to one another via the second source line,
wherein the second source/drain terminal of the first memory cell, the second source/drain terminal of the second memory cell, the second source/drain terminal of the third memory cell, and the second source/drain terminal of the fourth memory cell are electrically conductively connected to one another via the bit-line,
wherein the gate terminal of the first memory cell and the gate terminal of the second memory cell are electrically conductively connected to one another via the first word-line,
wherein the gate terminal of the third memory cell and the gate terminal of the fourth memory cell are electrically conductively connected to one another via the second word-line,
wherein the lever terminal of the first memory cell and the lever terminal of the third memory cell are electrically conductively connected to one another via the first lever-line, and
wherein the lever terminal of the second memory cell and the lever terminal of the fourth memory cell are electrically conductively connected to one another via the second lever-line.

18. The memory cell arrangement according to claim 17,
wherein each memory cell of the plurality of memory cells further comprises a field-effect transistor structure, and
wherein the field-effect transistor structure comprises a first source/drain region which is electrically conductively connected to the first source/drain terminal, a second source/drain region which is electrically conductively connected to the second source/drain terminal, and a gate electrode which is capacitively coupled to the gate terminal and to the lever terminal.

19. The memory cell arrangement, comprising:
a plurality of memory cells, wherein at least one memory cell of the plurality of memory cells is configured as the memory cell of claim 1, each memory cell of the plurality of memory cells comprising a first terminal, a second terminal, a third terminal, and a fourth terminal;
a plurality of control lines to address a first memory cell, a second memory cell, a third memory cell, and a fourth memory cell of the plurality of memory cells;
wherein the first terminal of the first memory cell and the first terminal of the second memory cell are electrically conductively connected to one another via a first control line of the plurality of control lines,
wherein the first terminal of the third memory cell and the first terminal of the fourth memory cell are electrically conductively connected to one another via a second control line of the plurality of control lines, wherein the second terminal of the first memory cell, the second terminal of the second memory cell, the second terminal of the third memory cell and the second terminal of the fourth memory cell are electrically conductively connected to one another via a third control line of the plurality of control lines, wherein the third terminal of the first memory cell and the third terminal of the second memory cell are electrically conductively connected to one another via a fourth control line of the plurality of control lines, wherein the third terminal of the third memory cell and the third terminal of the fourth memory cell are electrically conductively connected to one another via a fifth control line of the plurality of control lines, wherein the fourth terminal of the first memory cell and the fourth terminal of the third memory cell are electrically conductively connected to one another via a sixth control line of the plurality of control lines, and wherein the fourth terminal of the second memory cell and the fourth terminal of the fourth memory cell are electrically conductively connected to one another via a seventh control line of the plurality of control lines.

20. The memory cell arrangement according to claim 19, wherein the first terminal of each memory cell of the plurality of memory cells is a first source/drain terminal, wherein the second terminal of each memory cell of the plurality of memory cells is a second source/drain terminal, wherein the third terminal of each memory cell of the plurality of memory cells is a gate terminal, wherein the fourth terminal of each memory cell of the plurality of memory cells is a lever terminal, and wherein the first control line is a first source line, the second control line is a second control line, the third control line is a bit-line, the fourth control line is a first word-line, the fifth control line is a second word-line, the sixth control line is a first lever-line, and the seventh control line is a second lever-line.

* * * * *